(12) United States Patent
Savas et al.

(10) Patent No.: US 6,805,139 B1
(45) Date of Patent: Oct. 19, 2004

(54) SYSTEMS AND METHODS FOR PHOTORESIST STRIP AND RESIDUE TREATMENT IN INTEGRATED CIRCUIT MANUFACTURING

(75) Inventors: Stephen E. Savas, Taoyuan (TW); John Zajac, San Jose, CA (US); Robert Guerra, Fremont, CA (US); Wolfgang Helle, Munich (DE)

(73) Assignee: Mattson Technology, Inc., Fremont, CA (US)

( * ) Notice: Subject to any disclaimer, the term of this patent is extended or adjusted under 35 U.S.C. 154(b) by 70 days.

(21) Appl. No.: 09/692,255

(22) Filed: Oct. 19, 2000

Related U.S. Application Data
(60) Provisional application No. 60/160,554, filed on Oct. 20, 1999.

(51) Int. Cl.[7] .............................. B08B 7/04; B08B 7/00
(52) U.S. Cl. ........................................ 134/1.3; 134/1.1
(58) Field of Search .......................... 134/1, 1.3, 1.1, 134/1.2; 438/906, 725

(56) References Cited

U.S. PATENT DOCUMENTS

| | | | |
|---|---|---|---|
| 4,201,579 A | 5/1980 | Robinson et al. | 430/323 |
| 4,393,092 A | 7/1983 | Gill | 427/38 |
| 4,501,061 A | 2/1985 | Wonnacott | 29/591 |
| 4,529,860 A | 7/1985 | Robb | 219/121 PE |
| 4,857,140 A | 8/1989 | Loewenstein | 156/643 |
| 4,861,424 A | 8/1989 | Fujimura et al. | |
| 4,938,839 A | 7/1990 | Fujimura et al. | 156/628 |
| 4,961,820 A | 10/1990 | Shinagawa et al. | 156/643 |
| 4,980,022 A | 12/1990 | Fujimura et al. | 156/643 |
| 4,983,254 A | 1/1991 | Fujimura et al. | |
| 5,032,202 A | 7/1991 | Tsai et al. | |
| 5,037,506 A | 8/1991 | Gupta et al. | 156/646 |
| 5,057,187 A | 10/1991 | Shinagawa et al. | 156/643 |
| 5,174,856 A | 12/1992 | Hwang et al. | 156/643 |
| 5,198,634 A | 3/1993 | Mattson et al. | 219/121.43 |
| 5,200,031 A | 4/1993 | Latchford et al. | 156/659.1 |
| 5,200,361 A | 4/1993 | Onishi | 437/194 |
| 5,221,424 A | 6/1993 | Rhoades | 156/643 |
| 5,226,056 A | 7/1993 | Kikuchi et al. | 373/18 |

(List continued on next page.)

OTHER PUBLICATIONS

H. Namatsu et al. "Hydrocarbon–Oxygen Mixture as a Resist Etching Gas with Highly Anisotropic Etching Feature," *Journal of Electrochemical Society*, vol. 100, No. 2, Feb. 1983, pp. 523–525.

*Primary Examiner*—Alexander Markoff
(74) *Attorney, Agent, or Firm*—Wilson Sonsini Goodrich & Rosati

(57) ABSTRACT

Plasma systems and methods for supplying activation energy to remove cross-linked photoresist crust using ion bombardment of the substrate from a plasma, at reduced temperature, achieved in part by operating the processing chamber at low pressures. Reduced temperatures prevent "popping" of the photoresist which can cause particulate contamination. The gas flow may comprise a principal gas, an inert diluent gas, and an additive gas. Principal gases for HDIS may comprise oxygen, hydrogen, and water vapor at pressures less than about 200 mTorr and a bias may be applied to the substrate support. When low-k dielectric material is present on vertical surfaces, reduced ion bombardment on vertical surfaces may be used, and a protective layer may be deposited on those surfaces.

28 Claims, 15 Drawing Sheets

U.S. PATENT DOCUMENTS

| | | | |
|---|---|---|---|
| 5,227,341 A | 7/1993 | Kamide et al. | 437/229 |
| 5,228,052 A | 7/1993 | Kikuchi et al. | 373/18 |
| 5,234,529 A | 8/1993 | Johnson | 156/345 |
| 5,262,279 A | 11/1993 | Tsang et al. | 430/311 |
| 5,292,370 A | 3/1994 | Tsai et al. | 118/723 |
| 5,294,292 A | 3/1994 | Yamashita et al. | 156/643 |
| 5,300,460 A | 4/1994 | Collins et al. | 437/225 |
| 5,310,456 A | 5/1994 | Kadomura | 156/657 |
| 5,362,358 A | 11/1994 | Yamagata et al. | 156/643 |
| 5,382,316 A | 1/1995 | Hills et al. | 156/643 |
| 5,393,374 A | 2/1995 | Sato et al. | 156/643 |
| 5,403,436 A | 4/1995 | Fujimura et al. | 156/643 |
| 5,449,433 A | 9/1995 | Donohoe | 156/643.1 |
| 5,451,293 A | 9/1995 | Tabara | 216/13 |
| 5,462,635 A | 10/1995 | Ono et al. | 216/67 |
| 5,498,312 A | 3/1996 | Laermer et al. | 156/643.1 |
| 5,514,247 A | 5/1996 | Shan et al. | 156/643.1 |
| 5,534,231 A | 7/1996 | Savas | 216/67 |
| 5,556,501 A | 9/1996 | Collins et al. | 156/345 |
| 5,567,271 A | 10/1996 | Chu et al. | 156/659.11 |
| 5,628,871 A | 5/1997 | Shinagawa | 438/514 |
| 5,681,780 A | 10/1997 | Mihara et al. | |
| 5,691,117 A | 11/1997 | Lutsic et al. | 430/329 |
| 5,702,869 A | 12/1997 | Chien et al. | 430/313 |
| 5,747,387 A | 5/1998 | Koizumi et al. | 438/708 |
| 5,756,400 A | 5/1998 | Ye et al. | 438/710 |
| 5,811,022 A | 9/1998 | Savas et al. | 216/68 |
| 5,824,604 A | 10/1998 | Bar-Gadda | 438/725 |
| 6,068,784 A | 5/2000 | Collins et al. | 216/68 |
| 6,105,588 A * | 8/2000 | Li et al. | 134/1.1 |
| 6,281,135 B1 | 8/2001 | Han et al. | |
| 6,638,875 B2 | 10/2003 | Han et al. | |

OTHER PUBLICATIONS

K. Hirose et al. "Ion–Implanted Photoresist and Damage–Free Stripping," *Journal of the Electrochemical Society*, vol. 141, No. 1, Jan. 1994, pp. 192–205.

\* cited by examiner

Figure 6

| Parameter | Feedgas compositions for exemplary HDIS processes | | |
|---|---|---|---|
| | Embodiment #1 | Embodiment #2 | Embodiment #3 |
| Principal gas | oxygen | hydrogen | water vapor |
| Inert diluent gas | any noble gas, nitrogen | helium, argon, or nitrogen | helium, argon, or nitrogen |
| Additive gases | water vapor<br>oxides of nitrogen<br>oxides of sulfur<br>methyl, ethyl alcohol<br>hydrogen<br>methane<br>ammonia<br>methyl, ethyl amine<br>carbon dioxide<br>formaldehyde (oxides of sulfur, nitrous oxide, nitric oxide, nitrogen dioxide) | oxygen<br>methane<br>ammonia<br>water vapor<br>methyl alcohol<br>ethyl alcohol<br>oxides of nitrogen<br>(nitrous oxide, nitric oxide, nitrogen dioxide)<br>oxides of sulfur;<br>flows of the additive gases of the order or less for hydrogen | oxygen<br>methane<br>ammonia<br>water vapor<br>methyl alcohol<br>ethyl alcohol<br>oxides of nitrogen<br>(nitrous oxide, nitric oxide, nitrogen dioxide)<br>oxides of sulfur; flows of the additive gases less than about 30% of the total gas flow |
| Total gas flow | less than 3,000 SCCM | less than 3,000 SCCM | less than 3,000 SCCM |
| Pressure | ≤ 200 mTorr | ≤ 200 mTorr | ≤ 200 mTorr |
| Source power to plasma | 1,000 to 2,500 watts at 13.56 MHz | 1,000 to 2,500 watts at 13.56 MHz | 1,000 to 2,500 watts at 13.56 MHz |
| Bias power to pedestal | 0.1 to 2.0 watts/cm$^2$ | 0.1 to 2.0 watts/cm$^2$ | 0.1 to 2.0 watts/cm$^2$ |
| Wafer temperature | ≤ 100° C | ≤ 100° C | ≤ 100° C |

Figure 7

| Parameter | Feed gas compositions for exemplary via clean processes | | |
|---|---|---|---|
| | Embodiment #1 | Embodiment #2 | Embodiment #3 |
| Principal gas | oxygen | hydrogen | water vapor |
| Inert diluent gas | any noble gas, nitrogen | helium, argon, or nitrogen | helium, argon, or nitrogen |
| Additive gases | water vapor oxides of nitrogen oxides of sulfur methyl, ethyl alcohol hydrogen methane ammonia methyl, ethyl amine carbon dioxide formaldehyde (oxides of sulfur, nitrous oxide, nitric oxide, nitrogen dioxide), plus gases which contain fluorine or other halogen at up to 20% of the total gas flow rate | oxygen methane ammonia water vapor methyl alcohol ethyl alcohol oxides of nitrogen (nitrous oxide, nitric oxide, nitrogen dioxide) oxides of sulfur; flows of the additive gases of the order or less for hydrogen, plus gases (less than 10% of total flow) containing fluorine or other halogen | oxygen methane ammonia water vapor methyl alcohol ethyl alcohol oxides of nitrogen (nitrous oxide, nitric oxide, nitrogen dioxide) oxides of sulfur; flows of the additive gases no more than 30% of the total gas flow, plus fluorinated gas or other halogenated gases up to 20% of total flow |
| Total gas flow | less than 3,000 SCCM | less than 3,000 SCCM | less than 3,000 SCCM |
| Pressure | $\leq 200$ mTorr | $\leq 200$ mTorr | $\leq 200$ mTorr |
| Source power to plasma | 1,000 to 2,500 watts at 13.56 MHz | 1,000 to 2,500 watts at 13.56 MHz | 1,000 to 2,500 watts at 13.56 MHz |
| Bias power to pedestal | 0.1 to 2.0 watts/cm$^2$ | 0.1 to 2.0 watts/cm$^2$ | 0.1 to 2.0 watts/cm$^2$ |
| Wafer temperature | $\leq 100°$ C | $\leq 100°$ C | $\leq 100°$ C |

Figure 8

| Parameter | Exemplary embodiment of a two-step HDIS process | |
|---|---|---|
| | Step 1<br><br>Inductively coupled (or other high density) plasma source | Step 2<br><br>Conventional ashing process tool |
| Gas flows:<br><br>oxygen | 40 to 150 SCCM | greater than 1,000 SCCM |
| Pressure | 2 to 10 mTorr | 1 Torr |
| Source power<br>(to plasma) | 1.0 to 2.5 kW<br>at 13.56 MHz | 1 kW |
| Bias power to wafer pedestal | 25 to 150 watts<br>at 13.56 MHz | none |
| Wafer temperature | ≤ 100° C | about 250° C |
| Time of etch | 30 seconds<br><br>(to etch the crust, and only a small amount of the bulk photoresist lying beneath the crust) | to completion<br><br>(this step comprises the removal of the bulk of the photoresist under the crust, and is carried out in a conventional manner) |

Figure 9

| Parameter | Exemplary HDIS process when hardened inclusions are present | | |
|---|---|---|---|
| | Step 1<br>Crust etch | Step 2<br>Crust overetch | Step 3<br>Removal of bulk photoresist |
| Principal gas | predominantly oxygen | predominantly oxygen | predominantly oxygen |
| Pressure | 5 mTorr | 5 mTorr | 1.1 Torr |
| Source power to plasma | 2,000 watts at 13.56 MHz | 2,000 watts at 13.56 MHz | 800 watts at 13.56 MHz |
| DC Bias voltage to pedestal | ≤ 50 volts | ≤ 50 volts | none |
| Wafer temperature | ≤ 100° C | ≤ 150° C | 250° C |
| Time of etch | 30 seconds or less | 10 seconds or less | 30 seconds or less |

Figure 10

| Parameter | Exemplary HDIS process with hot pedestal | |
|---|---|---|
| | Step 1<br>crust removal | Step 2<br>stripping of bulk photoresist in the same chamber |
| Gas flows:<br>oxygen<br>additives | less than about 500 SCCM<br><br>any additive gas from figure 6 except fluorine containing gases | 1 to 3 SLM<br><br>any additive gas from figure 6 |
| Pressure | ≤ 50 mTorr | 1 Torr |
| Source power (to plasma) | ≥ about 200 watts | 800 to 1200 watts |
| Wafer temperature | 150° to 250° C | about 250° C |

Figure 12

| Parameter | Exemplary processes for stripping photoresist in the presence of silicon and carbon-containing low-k dielectrics (e.g. MSSQ and SiOC) | | |
| --- | --- | --- | --- |
| | Embodiment #1 | Embodiment #2 | Embodiment #3 |
| Principal gas | hydrogen, oxygen, methane | hydrogen | oxygen |
| Inert diluent gas | any noble gas, nitrogen | any noble gas, nitrogen | |
| Additive gases | ammonia, methyl alcohol, water vapor, and fluorine-containing gases (e.g., $C_2F_2$, $CHF_3$, and $CH_2F_2$) | | |
| Total gas flow | between 10 and 1,000 SCCM | less than 3,000 SCCM | |
| Pressure | 2 to 200 mTorr | ≤ 200 mTorr | 5 mTorr |
| Source power to plasma | between 200 and 2,000 watts | | less than 500 watts |
| Bias power to pedestal | 0.1 to 2.0 watts/cm$^2$ | 0.1 to 2.0 watts/cm$^2$ | 0.1 to 2.0 watts/cm$^2$ |
| Wafer temperature | ≤ 100° C | between 100 and 150° C | |

Figure 13

| Parameter | Exemplary processes for stripping photoresist in the presence of silicon and carbon-containing low-k dielectrics (e.g. MSSQ and SiOC) | | |
|---|---|---|---|
| | Step 1 version A | Step 1 version B | Step 2 |
| Principal gas | 20 SCCM oxygen 40 SCCM methane | 30 SCCM oxygen | hydrogen-based or oxygen |
| Inert diluent gas | | | helium or nitrogen |
| Additive gases | | ammonia, silane, methyl or ethyl alcohol, water vapor, nitrogen or nitrogen oxides, carbon dioxide | water vapor or alcohols |
| Total gas flow | between 10 and 1,000 SCCM | less than 100 SCCM | between 10 and 1,000 SCCM |
| Pressure | 5 mTorr | 2 to 10 mTorr | 2 to 200 mTorr |
| Source power to Plasma | 2,000 watts | 200 to 2,000 watts | 200 to 2,000 watts |
| Bias power to pedestal | 75 watts | 0.1 to 2.0 watts/cm$^2$ | 0.1 to 2.0 watts/cm$^2$ |

Figure 14

| Parameter | Branched and caged structures of non-carbon containing silsesquioxanes (HSQ and FOx™) |
|---|---|
| Gas flows: oxygen | less than about 1,000 SCCM  can be substantially oxygen |
| Pressure | 2 to 200 mTorr |
| Source power (to plasma) | 200 to 2,000 watts |
| Bias power to wafer pedestal | 0.1 to 1.0 watts/cm$^2$ |
| Wafer temperature | ≤ 100° C |

Figure 15

| Parameter | Exemplary processes for stripping photoresist in the presence of organic dielectrics | | |
|---|---|---|---|
| | Generic process | Specific process step 1 | Specific process step 2 |
| Principal gas | oxygen flow less than 50% of total, hydrogen containing gases, net reducing atmosphere | 2/3 water vapor; 1/3 methane | 60% methane 40% oxygen |
| Additive gases | hydrocarbons such as methane, ethane, propane, and butane; small cyclic hydrocarbons including cyclic butane, cyclopentane, cyclohexane, and benzene; alcohols such as methanol, ethanol, and propanol; and other gases such as carbon dioxide, hydrogen, nitrogen, ammonia, silane, disilane, TEOS, water vapor, formaldehyde, acetaldehyde, ethylene oxide. | | |
| Total gas flow | less than about 1,000 SCCM | 100 SCCM | 100 SCCM |
| Pressure | 1 to 200 mTorr | 2 to 10 mTorr | 2 to 10 mTorr |
| Source power to Plasma | 200 to 2,000 watts | 2,000 watts | 2,000 watts |
| Bias power to pedestal | 0.1 to 2.0 watts/cm$^2$ | 100 watts | 100 watts |

SYSTEMS AND METHODS FOR PHOTORESIST STRIP AND RESIDUE TREATMENT IN INTEGRATED CIRCUIT MANUFACTURING

REFERENCE TO RELATED APPLICATION

This application claims priority to U.S. provisional application No. 60/160,554 filed Oct. 20, 1999. U.S. application No. 60/160,554 is hereby incorporated herein by reference.

BACKGROUND OF THE INVENTION

1. Field of the Invention

The field of this invention relates in general to semiconductor processing. More particularly, the field of the invention relates to systems and methods of stripping photoresist and removing residues from a semiconductor substrate.

2. Background

Future semiconductor manufacturing technologies are expected to have stringent requirements for a variety of specific critical photoresist and residue removal processes, due in part to reductions in component size, increasing circuit speeds, and greater sensitivity of devices to surface contamination. These processes include, but are not limited to: 1) photoresist stripping following a high-dose ion-implantation (HDIS) process, 2) via cleaning, which means the removal of veils and residues following a via etch, particularly in the case where the dielectric layer through which the via is being formed is overlaying an aluminum or copper metallic layer, and 3) photoresist removal in the presence of a low-dielectric constant (low-k) material.

Current photoresist stripping methods are unable to cope with these new stringent requirements. For example, decreasing transistor sizes are making shallower and heavier doping levels necessary, which puts an additional burden on the photoresist mask used to protect the areas that will not be implanted. Another example has to do with vias, where residue free via surfaces are necessary for proper circuit function. Yet, such residues often contain metallic elements, and compounds of those elements with silicon and oxygen, and are therefore physically hard, chemically and reactive, and difficult to remove. As a final example, new requirements for increased speed of a semiconductor circuit dictate that the currently used quartz (silicon dioxide) or spin-on glass dielectric insulation between interconnects be replaced with materials having a lower dielectric constant. The reduction in the dielectric constant, k, reduces the capacitance from any one particular conductor line to an adjacent line, which simultaneously reduces crosstalk between these lines, improving signal speed and integrity. But photoresist removal can be difficult in the presence of a low-k dielectric material because conventionally used techniques are known to attack the dielectric material as well as the photoresist.

The use of a wet bath in the above-mentioned cases is becoming increasingly undesirable due to narrow feature widths, and the fact that materials are becoming increasingly sensitive to surface contamination and to damage from aggressive chemicals. Furthermore, there is increasing pressure to minimize the use of solvents or other wet chemical cleaning processes because of the associated environmental and health concerns, and the attendant costs. Therefore, photoresist stripping and residue removal processes which are critical to advanced circuit manufacturing will need to be accomplished by dry process techniques in the future.

Yet, in order for the integrated circuits fabricated by these dry processing systems to be cost competitive for the consumer electronics, communications and computation markets, the cost of these more difficult and expensive steps must be controlled. This means reducing processing time in the requisite equipment, which is expensive to own and operate. The dependence of wafer manufacturing costs on such processing times is typically multiplied by a factor of at least 10, since there will be that many more critical steps in manufacturing future integrated circuits. Many of the conventional photoresist removal processes—those not involving high dose ion implanted photoresist or low-k materials—are typically easier to perform and efficiently completed in a variety of ashing systems.

Conventional dry photoresist removal systems and processes typically cannot simultaneously meet all the requirements of the aforementioned critical photoresist or residue removal steps, since they exhibit one or more of the following deficiencies: 1) removing photoresist too slowly to be commercially competitive, 2) popping of photoresist previously subjected to high dose ion implantation because of the necessity of high temperature removal (a wafer temperature greater than or equal to about 110 degrees Celsius) in order to achieve commercially acceptable rates, 3) being unable to remove difficult residues or photoresist layers without causing damage to, or sputtering of, exposed sensitive materials, and 4) causing the oxidative degradation or erosion of exposed low-k materials as photoresist is removed.

Typical current-generation photoresist removal systems use remote, low density plasmas generated with gas pressures on the order of 1 Torr as their source of (mostly neutral) reactive species. Typically they use oxygen as the principal process gas. In order to etch the photoresist in such systems the temperature of the wafer may be maintained at or above about 150 degrees Celsius. The problem at these temperatures is that oxygen atoms created in the plasma source can cause the rapid oxidation of photoresist, which is desirable, but at the cost of supplying the necessary activation energy primarily by thermal means. Addition of other gases such as fluorine, nitrogen and/or hydrogen can modestly accelerate the oxidation rate, by chemical means, but not enough to make the process at low wafer temperatures comparable to that at elevated temperatures. In fact, the addition of fluorine to accelerate the reaction can have negative consequences, since it may etch exposed areas of silicon dioxide.

Next, a more specific discussion of the relevant background will be given as it applies to exemplary semiconductor processing applications: 1) photoresist removal following a high-dose ion-implantation process, 2) via cleaning or residue treatment processes, and 3) photoresist removal in the presence of a low-k dielectric.

High dose ion implantation is increasingly necessary to create the very high doping levels needed in thin silicon layers which serve as the components of a transistor in advanced ULSI circuits. Unfortunately, high dose levels can cause crosslinking and degassing of the carbon-based polymers in the photoresist mask. This produces a much tougher and less permeable material, called crust, in the top 1,000 to 3,000 angstroms of the photoresist layer. Such photoresist is subject to "popping" under higher temperature conditions, producing large numbers of carbon-rich particles which may cause defects in the succeeding patterning steps for the integrated circuits. Avoidance of popping typically requires that the processing temperature be kept below some threshold value (about 110 degrees Celsius). Above this temperature the bulk photoresist under the crust evolves organic solvent, leading to a high pressure state within the bulk photoresist which pushes up on the crust above.

FIG. 1 is a schematic illustration of the potential problems that may be encountered hen stripping photoresist at the elevated temperatures necessary to achieve commercially feasible strip rates. Referring to FIG. 1, region 102 is an area of silicon wafer 101 which has been ion implanted. The ion implantation process has created a hardened crust 105 on the photoresist mask shown generally at 106. Crust 105 is a crosslinked version of bulk photoresist 104, the crosslinking being a result of the ion bombardment (in other words, bulk photoresist that is exposed to ion bombardment becomes crosslinked). Layer 103 is a sacrificial oxide layer generally having a thickness of about a hundred angstroms. Photoresist removal processes that occur at high temperatures can build up a high pressure 107 within bulk photoresist 104, due mainly to residual solvents in the bulk photoresist. The mask shown generally at 108 has "popped" from the elevated pressure, leading to carbon-containing particulate contamination 109.

Because of the high activation energy required for reactions between oxygen and the highly cross-linked polymer chains in the crust, etching by conventional oxygen-based ashing processes proceeds at a much lower and commercially unacceptable rate. This is especially true if the wafer is kept at temperatures less than about 100 degrees Celsius to avoid "popping" of the photoresist. Removal of bulk photoresist and photoresist crust must also be carried out without compromising the integrity of protective layers (usually silicon dioxide, such as oxide layer 103) covering the sensitive silicon areas that were just implanted. Thus, ion sputtering or etching of the protective oxide layer 103 must be kept as low as possible. Addition of fluorine to the feedgas increases the etch rate of the crust to a level sufficient to produce economically competitive rates of wafer processing, but causes some etching of the sacrificial silicon dioxide, or leaves residual fluorine in the chamber or on the substrate, which may be harmful in succeeding process steps. For these reasons, it may be undesirable to add fluorine to the feedgas composition.

In photoresist stripping systems based on microwave generated plasmas, gases added to the oxygen-based feedgas promote the more rapid etching of the crust but the rate is still not adequate for situations where ion doses had been at the high end of the implant range. Some of these systems now use RF biasing power applied to the wafer pedestal to increase the energy of ions (from the strip plasma) striking the wafer surface. Ion bombardment promotes rapid reactions of oxygen with the crust, but the current density of ions in such systems is typically rather low (i.e. less than about 0.3 mA/cm$^2$), resulting in an undesirably high energy of ions at a given level of wafer biasing power. These ions could then cause sputtering of, or damage to, the silicon dioxide protective layer. As a result, there is a need for improved stripping of such hardened photoresist layers.

Via cleaning (removal of veils and treatment of residues) is a second example of semiconductor processing. Residues found lining via holes just after, for example, a dielectric etch, are often difficult to remove, whether by using acid, solvent, or plasma-based cleaning methods. Residues may contain a significant amount of the elements silicon and aluminum if the layer underlining the dielectric is aluminum and the etch process is continued to the extent that the aluminum is exposed. Conventionally, wafers are usually processed in an ashing chamber immediately following via etching, causing the aluminum-containing residues to be converted in part to compounds of aluminum and oxygen. Aluminum and oxygen containing compounds offer significant resistance to chemical and physical attack, since it will be appreciated that aluminum oxide is a hard, ceramic material. Furthermore, the smaller dimensions encountered in current technologies apply to vias as well, so vias are becoming increasingly narrow, and hence any residues contained inside are not as accessible.

The starting point for a typical via etching process is shown in FIG. 2A, and the resulting veils and residues in FIG. 2B. In FIG. 2A, photoresist 201 has been patterned on top of dielectric layer 202, where dielectric 202 may be, for example, silicon dioxide. The dielectric layer may have been deposited on top of a composite barrier layer, for example, TiN layer 203 and TiW layer 204. The barrier layers have, in turn, been coated on metal layer 205, which may be aluminum. Referring now to FIG. 2B, via 206 has been etched in dielectric layer 202. The etch may have been continued through the barrier layers such that metal layer 205 had been exposed, resulting in the deposition of etch byproducts in the form of veils 207, sidewall polymer 208, and residues 209. For the semiconductor device to function properly, the veils and sidewall polymer must be removed, and the residues either eliminated as well, or treated such that they can be more easily dislodged in subsequent steps (i.e., in a DI water rinse). The term "residues" will be used in this description to mean any kind of deposition of reaction byproduct, including veils and sidewall polymer.

Residues may contain a variety of etch byproducts, including, but not limited to, the following in both elemental and compound form: silicon, aluminum, carbon, fluorine, titanium, and oxygen. As a result, cleaning of these residues is becoming increasingly difficult in advanced circuit manufacturing, and frequently cannot be achieved with conventional dry residue removal systems. Typical current plasma-based downstream ashing chambers do not have the capability of inducing gas phase species to react chemically with residues to form compounds which are easily washed off in a deionized (DI) water rinse or mildly aggressive wet chemical bath. As a result, highly aggressive organic solvents are used extensively to remove residues. Aggressive organic solvents are expensive and involve potential hazardous waste disposal and safety issues; thus, there is a need for an improved plasma based method of removing residues that does not require aggressive organic solvents.

A third exemplary semiconductor processing involves the stripping of photoresist in the presence of a low-k material. As transistor sizes in ultra-large-scale integrated circuits shrink it is necessary to reduce the capacitance of the metal interconnection lines to each other to minimize the delays of signals and to reduce the "crosstalk." This permits circuits to maintain or increase speed as the size of the transistors is reduced, and can be accomplished best by using polymeric or other insulating materials on the integrated circuit chip which have a lower dielectric constant (k) than the conventionally used silicon dioxide. However, such low-k materials often have an organic or hydrogen content which is likely to be oxidized in the presence of the atomic oxygen typically used to strip photoresist. This is unfortunate, because oxygen atoms are the most effective species in current photoresist removal systems for the ashing of photoresist at economically competitive rates. As a result, typical photoresist removal systems are not able to rapidly and efficiently remove photoresist while avoiding degradation of low-k dielectrics.

Conventionally used silicon dioxide ($SiO_2$) has a dielectric constant of about 3.9 to 4.0. Fluorinated oxides have a dielectric constant of about 3.5. Fluorinated oxides are sometimes described by the acronym FSG, or by the symbols SiOF and $F_xSiO_y$. There are a variety of other silicon-containing low-k materials that are not a fluorinated version of the conventionally used silicon dioxide. "Carbon-doped glass," or SiOC, has a dielectric constant of about 2.5 to 3.1. The polysiloxanes HSQ, hydrogen silsesquioxane (HSiO$_{3/2}$)$_n$ and MSSQ, methyl silsesquioxane CH$_3$SiO$_{1.5}$)$_n$ have dielectric constants in the range 2.3 to 3.0. These materials are sometimes referred to as spin-on dielectrics (SOD's), or flowable oxides FOx (Dow Corning). Finally, there are low-k dielectric materials that do not contain silicon, and in fact are either purely organic or substantially organic. Fluorinated amorphous carbon (FLAC, or α-CF) has a dielectric constant in the range 2.3 to 2.7. Polymeric materials include fluorinated poly(arylene ether) (FLARE, Allied Signal), fluorinated polyimides(DuPont), parylene, polyphenylquinoxaline (PPQ), benzocyclobutene (BCB), and the like. Members of this latter group of purely or substantially organic materials have dielectric constants in the range of about 2.0 to 3.0.

The problem with etching silicon-based low-k dielectrics in the presence of oxygen is that the material shrinks physically, and its porosity increases upon oxidation, resulting in an undesirable increase in dielectric constant. Ultraviolet radiation also can cause degradation of such materials by way of the breaking of silicon-carbon and/or silicon-hydrogen bonds in the material. Porosity is undesirable because it causes the film to be prone to absorb moisture from the air, which is released upon subsequent heat treatments. Moisture release causes so-called "poisoning," which is a contamination of metal interconnects as the metal is being deposited into the vias (holes) in the low-k material. In this situation the metal interconnect's electrical resistance is greatly increased due to the chemical reaction of the water vapor with the metal being used to line or to fill in the holes.

Such low-k materials containing silicon can be even more sensitive to oxygen than the purely organic low-k materials. Oxidation of either HSQ or MSSQ converts Si—H bonds to Si—OH bonds, which cause the material to absorb moisture, become porous, and experience an increase in the dielectric constant. These events can lead to poisoning of the via. Materials such as Si—O—C, and Si—O—C—H materials deposited by plasma CVD, can also undergo degradation by oxidation. Conventional processes have substituted hydrogen for oxygen, or provided in some manner a net reducing atmosphere in an attempt to relieve some of these problems, but the addition of hydrogen to an oxygen-based plasma decreases the photoresist etch rate to commercially unacceptable values and may not provide sufficient protection of the low-k material.

FIGS. 3A and 3B are exemplary of the types of problems encountered when stripping photoresist in the presence of a low-k dielectric. Referring to FIG. 3A, the pattern of photoresist layer 301 has been transferred to hard mask 302 (which could also be a chemical mechanical polish stop layer), and this pattern will in turn be transferred to low-k layer 303 to create via 304. Exemplary materials from which the hard mask may be fabricated include, but are not limited to, SiON, SiO$_2$, and Si$_3$N$_4$. Photoresist layer 301 may be removed either prior to or during this via etching step. In either case, the use of oxygen-containing gases to strip the photoresist may cause an isotropic attack on horizontal surface 305, resulting in an undercut 306 of the hard mask.

FIG. 3B gives another example of the difficulties encountered when stripping photoresist in the presence of a low-k material, and illustrates one of several methods of performing a so-called Dual Damascene process. Referring to FIG. 3B, hard mask 312 (which may be, for example, silicon oxide or nitride) has been used to etch via 314 in low-k dielectric layer 313. Following this, photoresist 310 is used to etch a larger opening 317 in low-k layer 311, where the larger opening is axially aligned with via 314. The difficulty is that the low-k material is exposed on sidewalls 315 and 316, and this exposed area may be oxidized or degraded by chemical attack as the photoresist is removed. The sidewall may recede, causing the hole diameter to increase and undercutting the opening in the protective silicon oxide or nitride. This is undesirable since it makes the filling of the via with metal difficult, expensive and unreliable.

What is needed are systems and methods for stripping photoresist following an HDIS process, cleaning via veils and treating residues, and removing photoresist in the presence of a low-k material, at commercially viable rates, without photoresist "popping," excessive contamination, or degradation of the underlying materials.

BRIEF DESCRIPTION OF THE DRAWINGS

These and other features and advantages of the present invention will become more apparent to those skilled in the art from the following detailed description in conjunction with the appended drawings in which:

FIG. 6 is a table showing feedgas compositions for exemplary HDIS processes.

FIG. 7 is a table showing feedgas compositions for exemplary via clean processes.

FIG. 8 is a table showing conditions for an exemplary embodiment of an HDIS process.

FIG. 9 is a table showing conditions for an exemplary HDIS process when hardened inclusions are present.

FIG. 10 is a table showing conditions for an exemplary HDIS process with a hot pedestal.

FIGS. 12 and 13 are tables showing conditions for exemplary low-k processes for MSSQ and Si—O—C (—H) dielectrics.

FIG. 14 is a table showing conditions for an exemplary low-k process for HSQ and FOx™ dielectrics.

FIG. 15 is a table showing conditions for exemplary low-k processes for organic dielectrics.

DETAILED DESCRIPTION

Aspects of the present invention provide systems and methods for removing photoresist. In particular, exemplary embodiments of the present invention may be used to strip photoresist: 1) following a high-dose ion-implantation (HDIS) process, 2) in conjunction with a via cleaning or residue treatment process, and 3) in the presence of an exposed low dielectric constant material.

1. Exemplary Plasma Reactors

Exemplary embodiments of the present invention use a moderate to high density plasma source (e.g., a peak ion density of order of magnitude $10^{10}$ ions/cm$^3$ or greater) supplied with appropriate feedgas composition to generate fluxes of ions and reactive neutral species to the wafer to etch exposed photoresist and/or aid in the removal of residues in a cost effective manner. Exemplary embodiments of the present invention are capable of delivering cost effective solutions at significantly lower wafer temperatures, and with improved directionality compared with conventional ashing methods, without etching, sputtering or significantly damaging "essential" layers, by virtue of the ion current, ion energy, ion directionality, and the proper choice of gas chemistry. The "essential" layers for which sputtering is avoided include the protective silicon dioxide covering just-doped silicon, exposed copper or other metals, or exposed, substantially vertical, low-k material surfaces.

Figure 5:
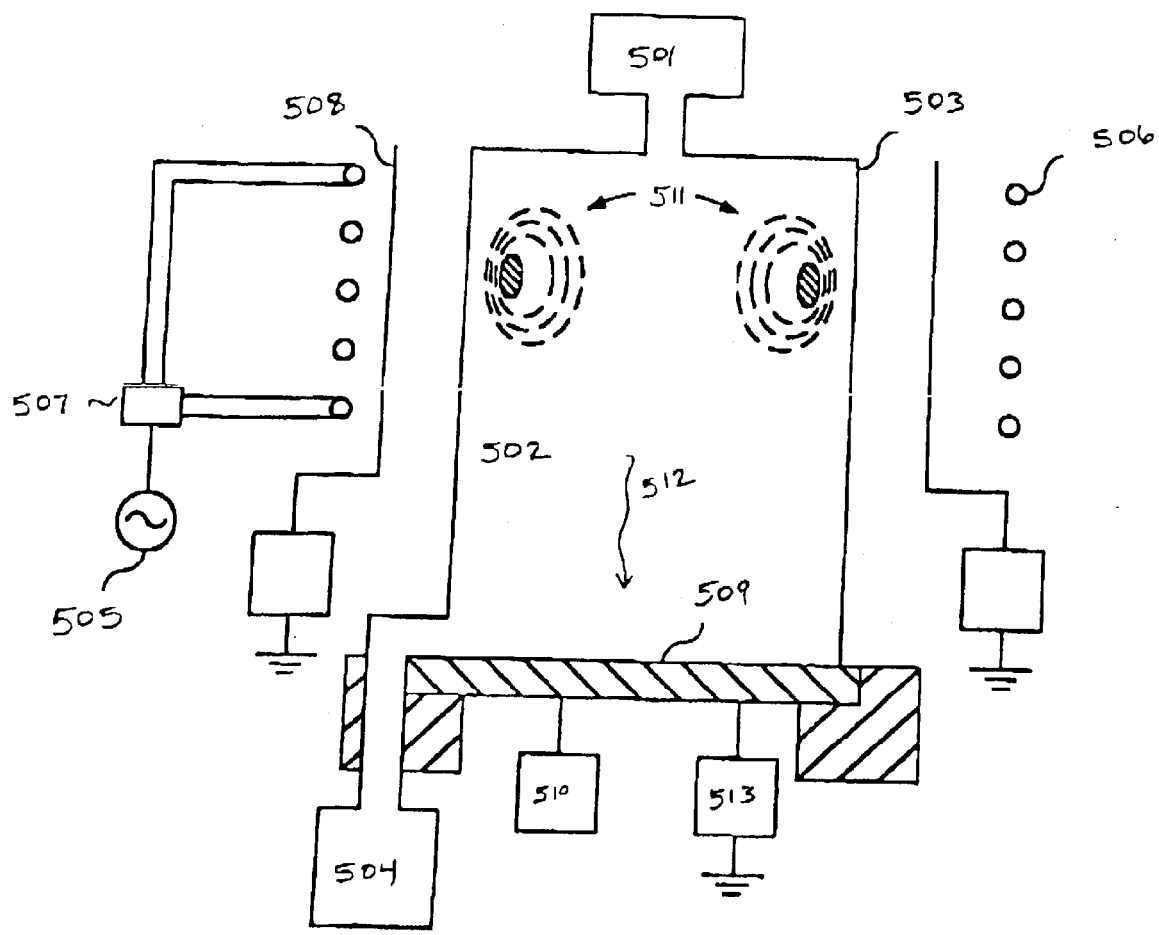
FIG. 5 shows an exemplary inductively coupled plasma reactor that may be used in connection with exemplary embodiments of the present invention.

Such a medium-to-high density plasma source both dissociates and ionizes molecules of the feedgas to produce fluxes of reactive neutral chemical species, as well as modestly energetic, somewhat anisotropic positive ions to the wafer surface. When additional energy is needed for such ions to activate the required surface reactions, it may be provided with the aid of a second source of radio frequency electric power connected to an auxiliary electrode(s) or the pedestal supporting the wafer. Energy is transferred to the ions mainly at a plasma sheath adjacent (and parallel) to the wafer surface; the sheath then accelerates the ions such that they bombard the wafer nearly perpendicularly. This is true even in the absence of a second RF power source or other means causing the plasma potential to be elevated. In the absence of an additional RF power source, the sheath potential is the "ambipolar potential" due to the differing mobilities of ions and electrons. The potential depends linearly on electron temperature, and, in the exemplary inductive reactor of FIG. 5, is typically in the range of 5 to 15 eV. The remaining process conditions, such as the selection of gases and their flow rates, are chosen to complement the plasma properties to achieve the desired result.

Next, the ion current concept will be considered in more detail. An important factor for the efficiency and quality of the HDIS and via clean processes is the moderate to high current (e.g., greater than or equal to about 0.3 mA/cm$^2$) of modestly energetic ions and neutrals (of order about 100 eV down to about 10 eV) providing the activation energy needed for the oxygen, hydrogen and/or hydroxyl radical reactions with the cross-linked carbon-based polymer comprising the crust. This bombardment permits the etching or residue conversion reactions to be done rapidly at lower temperatures without causing damage or excessive sputtering by virtue of the energy of the bombarding species. In an exemplary embodiment, wafer temperatures less than about 100° C. are used which permits etching of the crust without popping it, an undesirable effect having the potential to cause particulates to fall onto the wafer. Wafer temperatures less than or equal to about 85° C. may be used in other exemplary embodiments for all types of plasma sources, and temperatures as high as about 120° C. may be used in embodiments where the photoresist has been UV-baked.

Moderate to high ion current conditions (e.g., ion currents greater than or equal to about 0.3 mA/cm$^2$) may provide superior process results because the physics allows for an overall reduction of the energy of the ions bombarding the substrate, thus reducing the unwanted sputtering of any materials underlying the layer to be etched. The general relation that the biasing power is equal to the product of the ion current times the sheath voltage is a reasonable approximation of the physics involved. For a given amount of biasing power applied to the pedestal to provide the necessary and sufficient activation energy of the desired reactions, the approximation is that the higher the ion current density, the lower the ion energy. Thus, moderate amounts of biasing (e.g., power of about 25 to about 300 watts per wafer) may be provided without supplying the bombarding species with excessive energies. Higher ion energies of order 100 eV or greater are more likely to sputter or damage critical exposed materials.

Aspects of the present invention may be used in conjunction with any variety of plasma sources, but the source should be capable of delivering sufficient reactive neutral species and an adequate positive ion current density ($10^{10}$ ions/cm$^3$). The ion current is preferably distributed with reasonable uniformity (e.g., approximately +/−10% or less) over the surface of a 200 mm or greater semiconductor wafer. Examples of such sources may include but are not limited to: 1) resonant microwave plasma sources (electron cyclotron resonance, or ECR sources), 2) resonant cavity microwave sources, 3) non-resonant microwave plasma sources (including surface-wave sources), 4) UHF (ultra high frequency) plasma sources employing antenna(s) to couple electromagnetic energy of frequency greater than 100 MHz into the plasma, 5) resonant inductive plasma sources such as helicon wave sources, 6) resonant cavity inductive sources such as the helical resonator (e.g., operating at pressures up to about 300 mTorr), and 7) capacitively coupled plasma source (e.g., operating at pressures of up to about 10 Torr).

Figure 4:
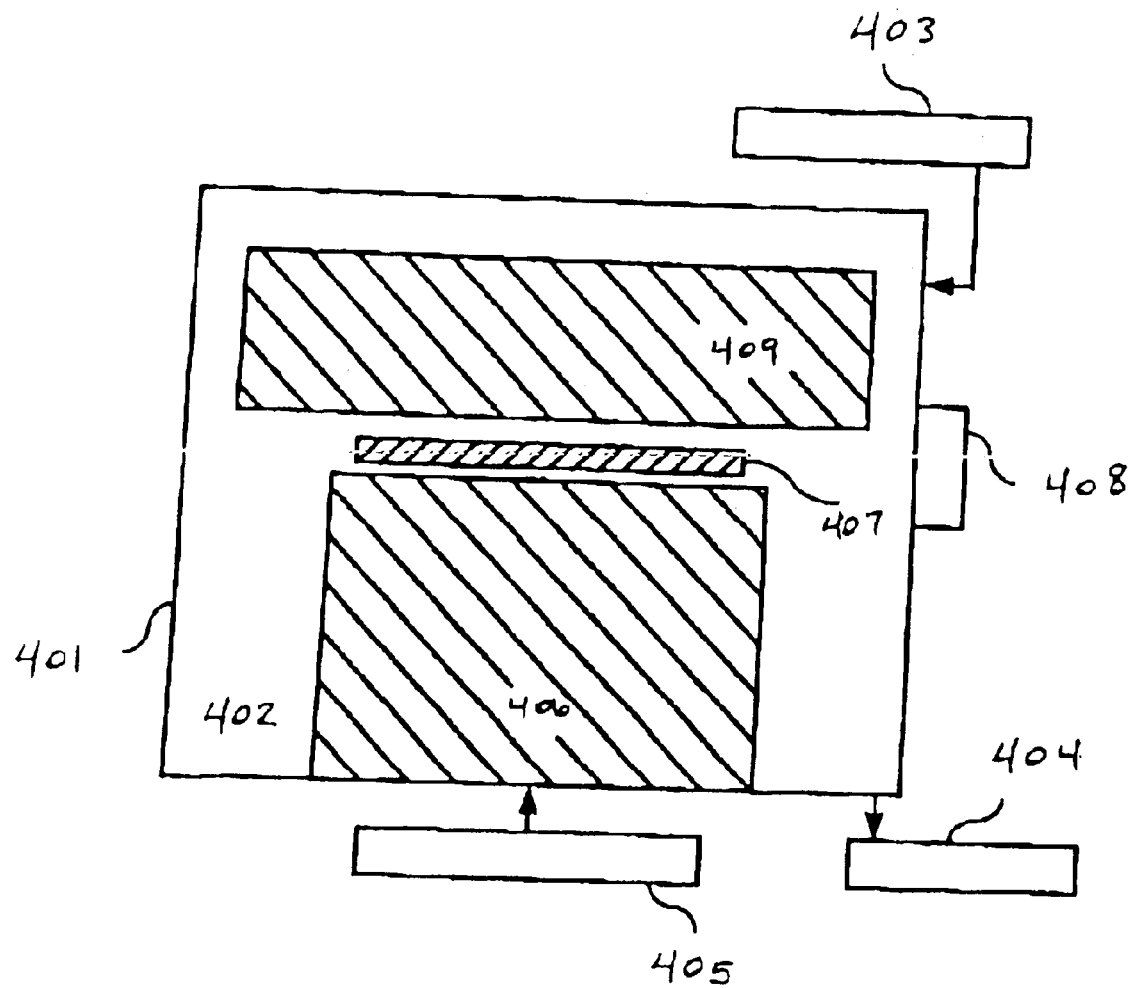
FIG. 4 depicts an exemplary capacitively coupled plasma reactor that may be used in connection with exemplary embodiments of the present invention.

Two exemplary reactor configurations, which may be used in connection with embodiments of the present invention, are shown in FIGS. 4 and 5. FIG. 4 shows an exemplary capacitively coupled source, which may be operated with a narrow spacing between the gas injection showerhead and the wafer, the spacing being on the order of 1 centimeter or less. The narrow spacing increases the ion density and ion current of the plasma. Referring to FIG. 4, the exemplary capacitively coupled reactor includes a metal wall 401 that encloses a plasma reactor chamber 402. Wall 401 is grounded. Gases are supplied to chamber 402 from a gas source 403 and are exhausted by an exhaust system 404 that actively pumps gases out of the reactor to maintain a pressure suitable for plasma processing. An RF power supply 405 is connected to a powered electrode 406 that capacitively couples power into chamber 402 to form plasma 409. The grounded wall 401 acts as the counter-electrode although a separate planar electrode opposite powered electrode 406 may also be used in some embodiments. A wafer 407 is positioned on or near powered electrode 406 for processing. A heater/temperature controller (not shown) may be used to control the temperature of the powered electrode and wafer for processing. Wafers are transferred into and out of reactor chamber 402 through a port such as slit valve 408 or the like. The RF power supplied to electrode 406 is typically at the ISM industry standard frequency of 13.56 MHz, but can also be 27.12 and 40.68 MHz or other frequencies.

Referring now to FIG. 5, which illustrates an exemplary inductively coupled plasma reactor for photoresist stripping, a gas source 501 is used to introduce a feedgas composition to plasma reaction chamber 502 defined by chamber walls 503. The gas is exhausted through exhaust system 504. An RF source 505 supplies RF power to induction coil 506 through a conventional impedance match network 507. The reactor system may or are may not contain a means for regulating the degree to which power is also capacitively coupled to the plasma; this may be controlled, for example, by shield 508. The wafer to be processed (not shown) sits on pedestal 509, which may be heated by a temperature control system 510 (which may comprise a heater and controller). Induction coil 506 produces within the top portion of chamber 503 an axially symmetric RF magnetic field whose axis is substantially vertical and an induction electric field that is substantially circumferential. The RF energy that is applied to the induction coil from source 505 is typically at a frequency of 13.56 MHz, although other frequencies may be used. Induction coil 506 allows control of the ions that are generated in plasma 511 versus the ion flux 512 that may be directed towards the wafer through the use of a DC bias (which may be provided by a second RF source 513) applied to the pedestal upon which the wafer sits.

Additional plasma reactor systems, components and configurations which may be used in connection with embodiments of the present invention are described in U.S. Pat. No. 5,534,231, U.S. Pat. No. 5,811,022, U.S. patent application Ser. No. 08727,209 filed Oct. 08, 1996 for *Apparatus and Method for Pulsed Plasma Processing of a Semiconductor Substrate*, U.S. patent application Ser. No. 08/811,893 filed Mar. 05, 1997 for *ICP Reactor Having a Conically-Shaped Plasma-Generating Section*, U.S. patent application SER. No. 09/192,835 filed Nov. 16, 1998 for *Downstream Surface Cleaning Process*, U.S. patent application Ser. No. 09/192,810 filed Nov. 16, 1998 for *Systems and Methods for Variable Mode Plasma Enhanced Processing of Semiconductor Wafers*, and U.S. patent application Ser. No. 09/200,660 filed Nov. 25, 1998 for *Systems and Methods for Low Contamination, High Throughput Handling of Workpieces for Vacuum Processing*, each of which is hereby incorporated herein by reference in its entirety.

The fact that the ion current to the substrate may be intensified by operating a plasma reactor at the lower end of its functioning range of gas flows and pressures is an important feature for several embodiments of the present invention. Indeed, the relevance and relationship of ion current to ion energy is of importance to many aspects of these embodiments, regardless of the type of plasma source that is being utilized. Since ion currents and ion energies are determined in part by the pressure at which a reactor is operating, which in turn is determined partially by the feedgas flow, these parameters will be considered next.

A high-density plasma reactor, such as the inductively coupled reactor of FIG. 5, may be operated for exemplary embodiments at pressures less than the 1–2 Torr typically used in conventional inductive ashing tools. Exemplary pressures in such embodiments may range from about 1 to 200 mTorr. The capacitively coupled reactor of FIG. 4 may be utilized in exemplary embodiments at pressures of up to about 10 Torr when the plasma contains an inert diluent gas, and up to about five Torr without the diluent. Exemplary gas flows used to sustain these pressures are about 3,000 SCCM (standard cubic centimeters per minute) or less for an inductively coupled or other high-density plasma source, and up to about 10 SLM for a capacitively coupled source. More typically, in exemplary embodiments, a gas flow of 10 to 500 SCCM, or any range subsumed therein, may be used for high-density plasmas, and about 2000 to 3000 SCCM, or any range subsumed therein, may be used for a capacitively coupled source.

2. HDIS and Via Clean/Residue Removal

Typical feedgas compositions for the HDIS and via clean processes will now be discussed. The principal active species may be mixed with an inert diluent gas, such as any of the noble gases or nitrogen, and the feedgas composition may include an admixture of other gases called additive gases. Such additive gases may include any one or a combination from among the following: water vapor, oxides of nitrogen, oxides of sulfur, methyl or ethyl alcohol, hydrogen, methane, ammonia, methyl or ethyl amine, carbon dioxide, and formaldehyde. The oxides of nitrogen may include nitrous oxide, nitric oxide, and nitrogen dioxide. In the case of the via etch and residue removal process, gases which contain fluorine, chlorine, or bromine may also be used at concentrations, which may range, for example, up to about 20%–30% of the total gas flow rate depending upon the particular process. The purpose of such additives is to provide reactive species which form soluble compounds, or at least compounds which may later be more easily removed, with the constituent elements of the residues. Ions may be used to provide the requisite activation energy, and may also furnish active chemical species to promote such reactions. The current density (measured at the surface of the wafer) of energetic bombarding species is generally at or above about 0.5 mAmperes/$cm^2$ in exemplary embodiments. An RF power of at least about 200 watts is typically supplied to the plasma to maintain this level of ion current density.

The wafer temperature for the HDIS process, when oxygen is used as the principal active ingredient, is typically less than or equal to about 100° C. in exemplary embodiments. For instance, in one exemplary process, the wafer temperature is about 85° C. In HDIS processes where the photoresist is UV baked before the ion implant process, a higher wafer temperature may be used and may range, for example, up to about 120° C.

In an alternative embodiment, hydrogen is used as the dominant chemically active species. Due to flammability concerns, however, these processes typically use less than about 10% by flow of hydrogen in an inert gas diluent such as helium, argon, or nitrogen. Small amounts of other gases (additive gases), typically having flows of the same order or less than the hydrogen, may be included in the feedgas. Examples of additive gases are: oxygen, methane, ammonia, water vapor, methyl alcohol, ethyl alcohol, oxides of nitrogen including nitrous oxide, nitric oxide and nitrogen dioxide, nitrogen, or oxides of sulfur. Additive gases comprising fluorine, chlorine, or other halogen may help in removing silicon or metal containing residues in the via cleaning case.

Another embodiment of feedgas composition for high dose implant stripping (HDIS) or via residue cleaning involves use of water vapor as the predominant gas. An inert diluent gas such as helium, argon, or nitrogen can be used as a carrier gas, or as a diluent for the water vapor. The wafer temperature is maintained at a value less than about 100° C. for the HDIS process, and small amounts of additive gases, as described above, can be included with the water vapor. These additives generally are less than about 30% of the total gas flow. Again, a fluorinated gas or other halogenated gases may be added in amounts up to about 20% of the total flow for the via residue removal process.

FIGS. 6 and 7 are tables summarizing exemplary feedgas compositions for HDIS and via clean. The wafer temperature, current density, and RF power to the plasma source, and DC bias conditions may be similar in these exemplary embodiments, regardless of whether oxygen, hydrogen, or water vapor is used as the principal ingredient.

Additional exemplary processes will now be described, starting with reference to FIG. 8. In one embodiment of an HDIS process, a two step procedure may be used. The first step etches the crosslinked photoresist crust, and the second step removes the bulk photoresist beneath the crust. The first step of this embodiment utilizes an inductively coupled plasma source of diameter approximately 7.8" (for processing 200 mm wafers) operated at a pressure of between about 2 and 10 mTorr with an oxygen flow of about 40 to 150 SCCM, a first source power of about 1,000 to 2,500 watts (at 13.56 MHz) applied to the induction coil, and a second source of RF power at 13.56 MHz supplying a bias of between about 25 and 150 watts to the pedestal which supports the wafer. The duration of the first step is about 30 seconds, or long enough to etch through the crust and possibly a small amount of the un-crosslinked photoresist beneath. The second step removes the bulk of the photoresist with oxygen flowing at around 1,000 SCCM, the pressure set to about 1 Torr, the source power to the plasma adjusted to about 1 kW, and the wafer temperature maintained at about 250° C. In this embodiment, no bias power is applied to the pedestal during the second step.

An alternative embodiment of the HDIS process will now be described for the case where there are hardened inclusions located within the bulk of the photoresist, just beneath the crust. This embodiment comprises three steps. Etching of the crust is begun in a first step with an inductively coupled or other high-density plasma source. The wafer is maintained at room temperature. No further cooling of the wafer is required because the etch rate is high enough that the crust is removed before the wafer heats up (in other words, before the crust has had a chance to "pop"). The crust removal conditions are maintained in a second step for a duration of about 30 to 40% of the first step (crust removal) time. Alternatively, the duration of the second step may continue for some additional time past the finishing of crust removal, as determined by an optical emission-based endpoint. The purpose of the second step is to remove any hardened inclusions embedded in the bulk photoresist, which would be resistant to oxidation (removal with oxygen) in the third, bulk photoresist removing step. The third step is carried out with a high pressure, radical (neutral species) based ashing process. If the second step is not performed where hardened inclusions are present, the hardened inclusions may remain on the substrate as particulate debris. If some wafer cooling is desired for the first and second steps, it may be provided by flowing a gas such as helium to the backside of the wafer to allow the excess heat to be conducted to the pedestal.

Exemplary conditions for this three-step HDIS process, tailored for the situation where hardened inclusions are present, are illustrated in FIG. 9. In a particular embodiment where 75 watts of biasing RF power is utilized in the first step for ion energy enhancement at a source operating pressure of 5 mTorr (oxygen only) and power of 2,000 watts, the crust of the photoresist is etched very rapidly—typically less than 30 seconds for even heavy doses of dopant ions at energies near the maximum practical level (i.e. $1.5 \times 10^{16}$ ions/cm$^2$ for arsenic ions at 80 keV, or $5 \times 10^{15}$ ions/cm$^2$ of phosphorus at 120 keV). It was observed that the wafer heated to about 40° C. in 5 seconds. Therefore, if the wafer begins the process at room temperature it should not exceed 100° C. at the conclusion of the crust etching step. The DC bias voltage on the wafer is about 50 volts or less in this embodiment, and the resulting sputter loss of the silicon dioxide is less than about 5 angstroms (in other words, there is only a 5 angstrom oxide loss that occurs during crust removal). In this embodiment, the etching conditions are identical in the first and second steps, except that the wafer temperature in the second step is less than about 150° C. and the time of the etch (this is an "overetch") is about 10 seconds or less. In the third step, during which the bulk photoresist is removed, the gas chemistry again comprises oxygen but the pressure is now about 1.1 Torr. The source power to the plasma in the third step is 800 watts, there is no bias power is applied to the pedestal (and thus the DC bias voltage is zero), and the wafer temperature is less than about 250° C. The time of the third step etch is typically about 30 seconds or less.

In one particular instance, photoresist that had been subjected to an ion implantation step of $1.5 \times 10^{16}$ arsenic atoms at 80 keV was stripped from the center of a wafer in 15 seconds, and from the edge of the wafer in 23 seconds. The crust removal (first step) was carried out in an oxygen plasma at a pressure of 5 mTorr, and with 75 watts bias power. The bulk photoresist removal (second step) was performed with a higher pressure ashing process in a separate chamber. The ion implantation step had formed a crust that would have been difficult to strip in a conventional asher; nonetheless, there were no visible residues at the conclusion of the procedure.

Although no extraordinary measures were necessary to remove the residues in the example just given, there may be times when an additional step is needed to facilitate residue removal for a subsequent wet cleaning step. These "really tough" residues are non-volatile oxides of arsenic, phosphorus, boron, aluminum, titanium, and silicon that remain on the surface of the substrate after the bulk ashing step is completed. The post-ashing, plasma-based step is done to loosen the residues, convert them to water soluble forms, and facilitate their reaction with any other components of the wet bath to follow. The feedgas composition of this "residue-treating" step comprises either hydrogen or water vapor, where the hydrogen is in a diluent selected from the group consisting of helium, argon, and nitrogen. The feedgas composition may include a fluorine-containing additive.

Another exemplary HDIS process uses a "hot pedestal" and may be performed in a single process chamber. In a first step, a wafer is placed on a hot pedestal (between 150 and 250° C.) for crust removal. Although this may seem likely to contribute to crust popping, the wafer does not heat particularly quickly because the pressure is kept below about 50 mTorr, and hence there is little gaseous heat conduction from the pedestal to the wafer. Radiative heating of the wafer is also rather slow, in this case being about 10° C. per minute. After the crust is gone, the removal of the remaining bulk photoresist from the wafer is finished in a second step, without moving the wafer, by raising the pressure to about 1 Torr or more. This increase in pressure changes the process in the second step from one based on both ions and neutrals to one based predominantly on neutral radicals. The wafer responds to the elevation in pressure by rapidly increasing to a temperature close to that of the pedestal, commensurate with an oxygen radical-based, high stripping rate ashing process.

Exemplary conditions for a "hot pedestal" embodiment of the HDIS process are shown in FIG. 10. The gas chemistry in the first step comprises mainly oxygen. The additives listed in FIG. 6 may be used, although fluorine-containing gases generally would not be used in this process. The source power to the plasma in the first step is greater than or equal to about 200 watts. The total gas flow is less than or equal to about 500 SCCM. When the pressure is raised to about 1 Torr in the second step, and the RF power increased to about 800 to 1200 watts. The plasma then becomes an efficient radical (neutral) source. The total gas flow is increased to about 1 and 3 standard liters per minute (SLM) per wafer to sustain the desired pressure.

To remove photoresist and to remove and/or facilitate the removal of residues from a wafer following a via etching process, residues are caused to react chemically with the various reactive and energetic species originating from the plasma. These reactions make products which are either volatile, soluble in water, or reactive in low to moderately aggressive wet cleaning baths. At times it is desirable to perform such processing with a wafer temperature of about 150 degrees Celsius or lower. At these temperatures the ions from the plasma provide activation energy to promote such reactions. In order for the process to be rapid enough to have commercial efficiency, a substantial amount of power may be provided to the ions. This may be accomplished in exemplary embodiments by using a bias power of about 0.1 to 1.0 watts/cm$^2$, and an ion current density of more than about 0.3 mA/cm$^2$. Generally, ion energies are limited to less than about 100 eV per ion. In this energy range, ions can still successfully promote both photoresist removal and residue treatment The consequence of higher ion energies may be sputtering of exposed metal and/or other materials at the bottom of the via. Such sputtering may be deleterious for at least two reasons: 1) the sputtered byproducts can redeposit on the sidewalls and surfaces of the device being fabricated, and 2) the sputtering itself causes an erosion of the layers that must be left intact (those layers are protective silicon dioxide in the case of HDIS, and aluminum in the case of via etch residue treatment). The net result of excess ion energy, of course, is a declining yield of viable integrated circuits.

It is also helpful to device function for the via residue removal process to chemically convert the thin layer of metal oxide and/or fluoride (which may have been formed in earlier etching steps) on the surface of the exposed metal at the bottom of the vias to metallic form by removing the oxygen or fluorine. This layer of material may be chemically very stable with extremely high activation energies for reduction reactions. In order to accomplish this step in the process it may be effective to use predominantly hydrogen gas (and very little or no oxygen) mixed in an inert diluent, preferably Helium, but may also be nitrogen or Argon, under plasma and wafer bias conditions substantially the same as for the earlier steps in the process. In this case the hydrogen (energetic neutrals or ions) react with the metal oxide or fluoride to reduce it to metallic form and release volatile hydroxyl, water vapor or HF which desorb from the surface and are pumped out. In this case the resistance of connections made to such metal lines in succeeding steps in the manufacturing process may be reduced, increasing the value of the device. Gases such as $NH_3$ may be used, if desired diluted in inert gases, instead of dilute hydrogen to provide a source of hydrogen atoms and/or ions.

In case the underlying metallic layer is copper the chemical nature of the residues may be different, which will affect the choice of gases for the residue treatment. In one case we have observed that for vias in silicon dioxide with exposed copper at the bottom of vias, the use of oxygen, by itself or with the addition of Fluorine, results in polymer deposits being left at the base and on the sidewalls of the vias. In this case a recipe including hydrogen as the principal reactive gas in helium diluent (10% $H_2$ in He) with a small (4%) addition of $C_2F_6$ removes the residues leaving clean vias. One embodiment of the process for this application takes place between 2 mTorr and 10 mTorr with the total flow of gas being about 100 SCCM, while the power provided to the inductive plasma source is between about 1.5 kW and 2.5 kW, and that provided to bias the pedestal is between about 100 Watts and 200 Watts. The use of the helium diluent in this case is desirable since it results in much reduced sputtering of the exposed copper at the base of the via relative to the sputtering which would be caused by other diluents such as Nitrogen or Argon for the same process conditions.

One embodiment of a process for facilitating removal of very tough and difficult to remove via residues (which often contain metallic oxides with silicon and carbon making them very tough) was successfully done for silicon dioxide dielectric with Aluminum metal underlayer at the via bottom using an inductively coupled plasma source. The process conditions were: power to the ICP source of 1000 to 2000 Watts, at a pressure of between 2 and 10 mTorr with 25 to 75 Watts of power input to the wafer pedestal and an oxygen flow rate to the source of about 30 SCCM for 90 seconds. The wafer at the beginning of processing was at room temperature. The wafer was free of the visible residues at the conclusion of the process. Usage of oxygen as the dominant gas may not be desirable in case there is low-k material with organic content exposed on the via sidewalls as described further below. Whether or not there is low-k material present it also may be helpful to use some small amount of added Fluorine containing gas (such as $CF_4$, $CHF_3$, $CH_2F_2$ or other partially Fluorinated Hydrocarbons) in order to help the chemical degradation of the residues which often contain metals and/or silicon. Other gases which may be added include Hydrogen diluted in Nitrogen, Nitrogen, Ammonia, methane, water vapor, methyl alcohol.

The above techniques of controlling gas composition, power, pressure, ion current, on energies and wafer temperature may be used to tailor photoresist and residue removal for variety of applications.

3. Low-K Materials

Figure 1:
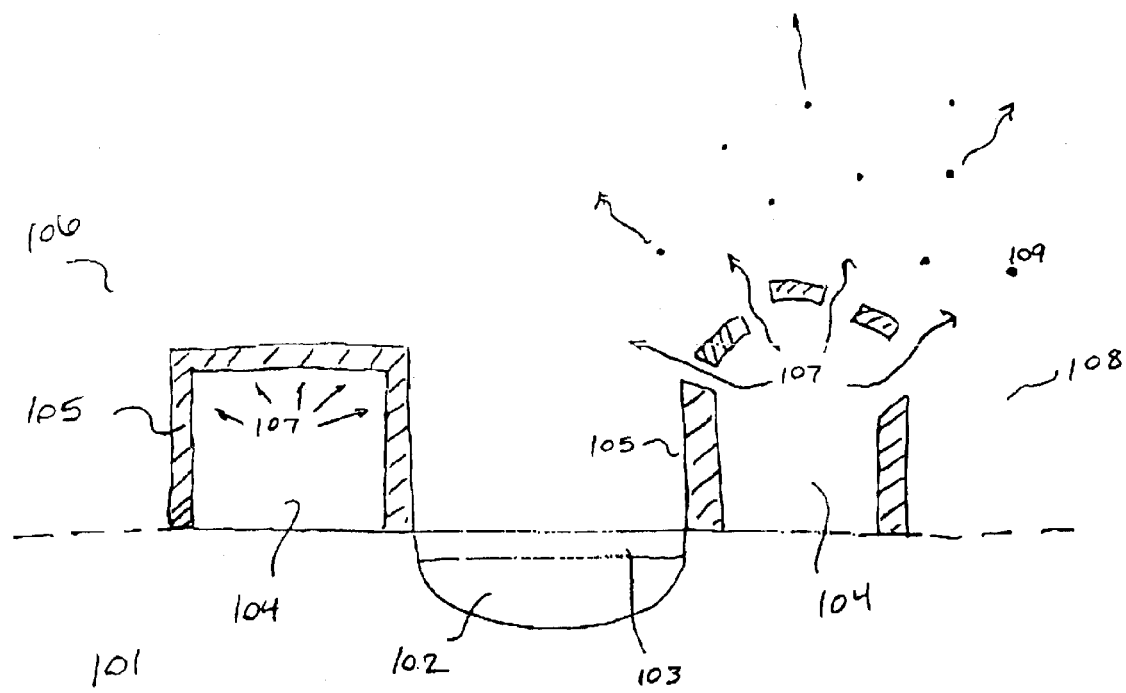
FIG. 1 illustrates a conventional process of removing photoresist following an HDIS process, with the resultant "popping" that can occur.
Figure 2A:
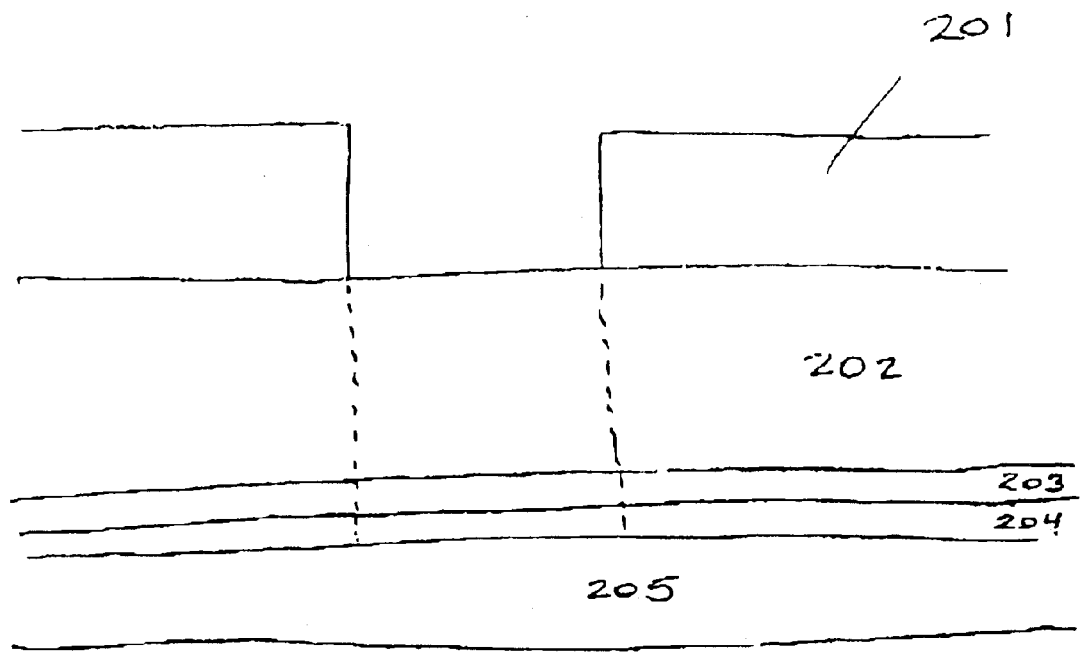
FIGS. 2A and 2B illustrate the need for a via clean following a via etch process, in which veils, sidewall polymer, and residues must be removed.
Figure 2B:
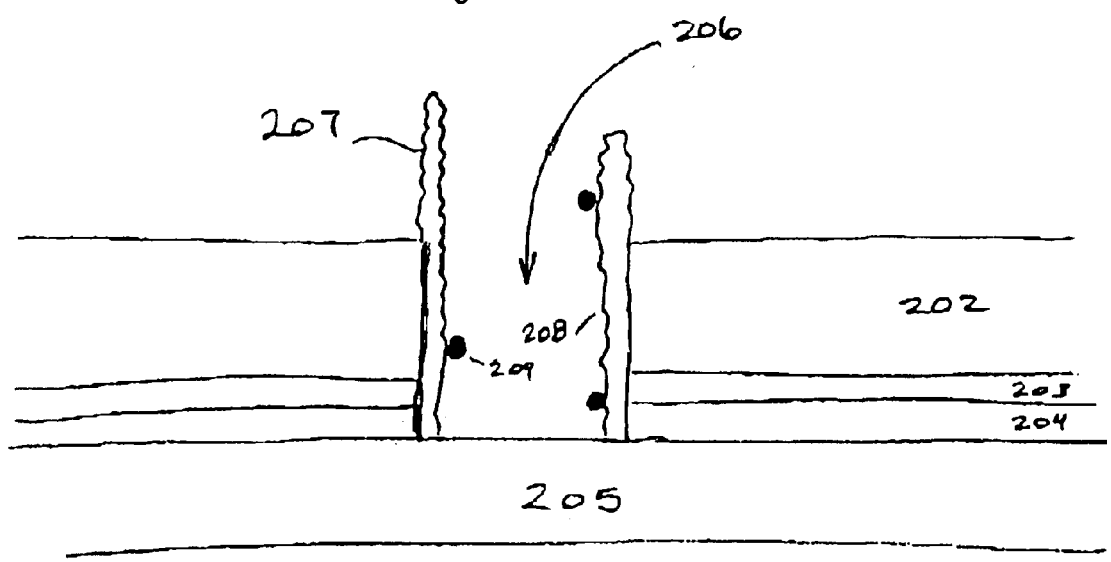
Figure 3A:
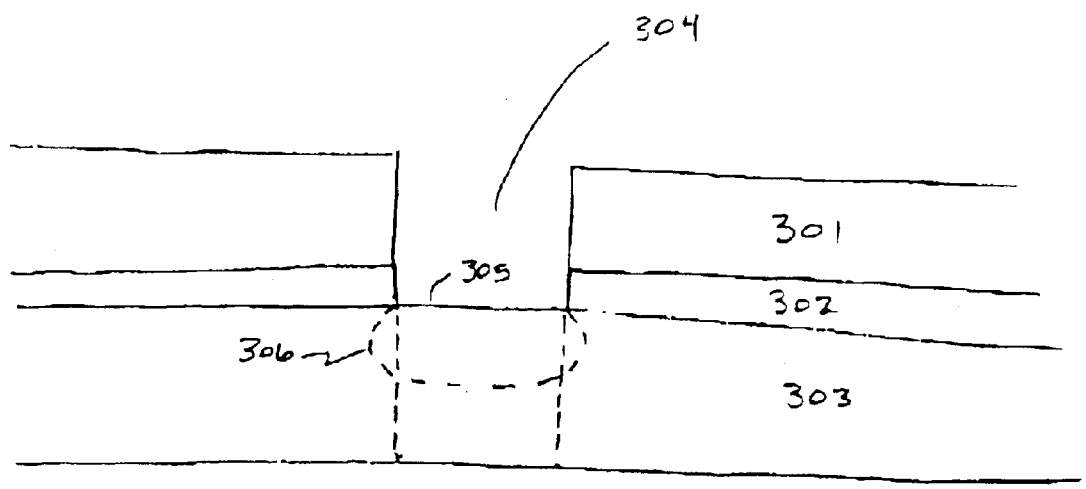
FIGS. 3A and 3B show the undercutting of a hard mask, and the attack of a sidewall that can occur when a low-k material is exposed to an oxygen-based plasma.
Figure 3B:
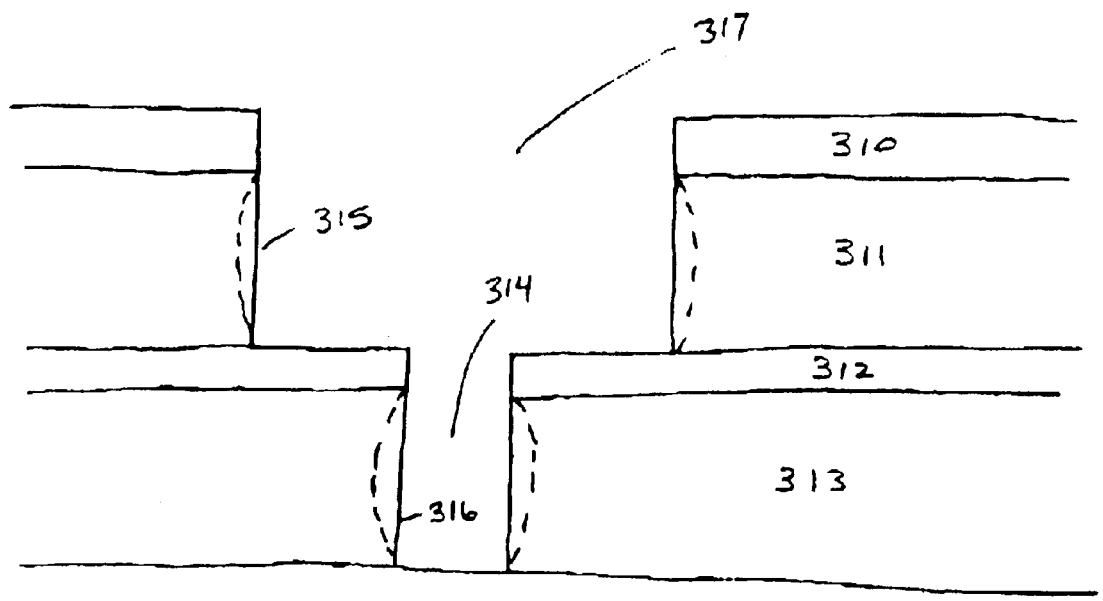

Photoresist and/or residue removal in the presence of low-k materials may pose particular challenges and processes tailored for these applications will now be described. The Dual Damascene example of FIG. 3B is reminiscent of a situation that arises frequently in semiconductor manufacturing: the need to strip photoresist while there are vertical surfaces of a low-k material exposed on the sidewalls of the via that has just been etched. The exposed low-k surfaces pose a challenge to the IC fabricator because often stripping agents are as reactive to the dielectric as they are to the photoresist. In exemplary embodiments of the present invention, the problem can addressed with the following techniques, individually or in combination: 1) use of a substantially anisotropic etch, taking advantage of the directionality of the ions in such a situation, and 2) shielding the sidewalls by causing a protective layer to be deposited.

In exemplary embodiments, the above techniques are used with a plasma source capable of generating a medium-to-high ion current density. The plasma source produces charged ions and neutral radicals that react with, or provide the activation energy for, chemical reactions with photoresist and residues. The ions are accelerated towards the wafer surface at directions substantially perpendicular to the plane of the wafer, and thus they travel parallel to, or nearly parallel to, the vertical surfaces of the low-k material comprising the sidewalls of the vias. Consequently, the ions impinge on the vertical surfaces much less frequently than on the horizontal surfaces that are parallel to the wafer plane, and when they do strike the sidewall, they do so at grazing incidence angles. Charged ions bombard the horizontal surfaces with fill intensity at or near normal incidence.

Ion bombardment with a medium-to-high flux permits removal of the photoresist to occur at commercially feasible rates, even if the wafer is at a low temperature. In the absence of such ion bombardment, the neutral radicals from the gas phase may not possess the necessary chemical reactivity or activation energy to cause the reaction to occur. Since ion bombardment is minimal on the vertical surfaces, reaction rates at these locations are relative low and, as a result, the low-k surface is protected.

Anisotropic etching can be accentuated by the addition of a component to the feedgas which is polymer-depositing on surfaces that experience little or no ion bombardment. This approach takes advantage of the fact that bombarding ions are often able to breakthrough whatever polymer layer is deposited on horizontal surfaces, and thus etching can proceed in the desired direction (i.e., normal to the plane of the wafer). Since there is little ion bombardment on vertical surfaces, deposition of the polymer layer proceeds undisturbed, the thickness of the protective layer increases as the etch progresses, and the low-k material comprising the sidewall of the via is preserved.

An example of the role sidewall protection plays in anisotropic etching may be seen with the conventional etching of a via in silicon dioxide. A fluorocarbon additive may be included in the feedgas, forming a protective silicon-containing fluoropolymer on the sidewalls of the via, where the ion bombardment is below a certain power density. Alternatively, sputtered photoresist fragments from a mask whose pattern is being transferred to the oxide layer below may contribute to a hydrocarbon-based protective layer for the sidewalls.

The appropriate feedgas additives for sidewall protection in the case of via etching into a low dielectric constant material is discussed further below. A generalized description of process conditions will be given first, with an emphasis on feedgas chemistries, followed by a detailed discussion of exemplary variations as they pertain to specific classes of low-dielectric materials.

In exemplary embodiments for photoresist stripping in the presence of a low-k material, gases containing oxygen, an oxygen-containing gas, hydrogen, a hydrogen-containing gas, and/or water vapor may be used as the principal active species. Positive ions and neutral species from the plasma react with the photoresist to yield volatile products consisting of carbon oxides, water vapor, and volatile hydrogen and carbon containing molecules. The low-k materials may have an organic or a silicon/hydrogen content, and may be subject to oxidation by oxygen, hydrogen, and hydroxyl radicals from the plasma. To protect the low-dielectric sidewalls from these radicals the feedgas may further include a polymerizing component such as a carbon or silicon-containing gas.

One such feedgas composition comprises a mixture of oxygen and methane gases. The role of the oxygen is to strip the photoresist. The role of the methane is to provide a source of hydrocarbon fragments to condense on the sidewalls of the via, thereby forming a layer that protects the low-k material surrounding the via from attack by oxygen. The ratio of the principal active ingredient to the polymerizing component is selected to balance the etch rate and level of protection for the sidewall. The appropriate amount of methane may be determined not only by the ratio of the flows of the two gases, but by strip rate and the surface coverage of photoresist as well.

Figure 11A:
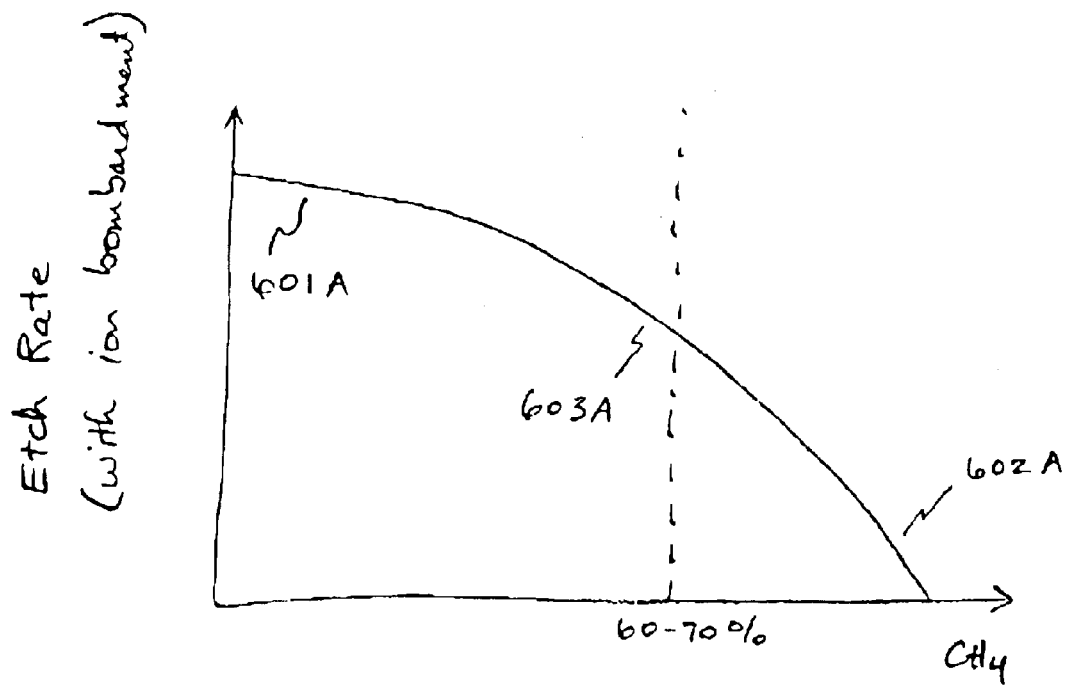
FIGS. 11A and 11B graphically depict etch rate as a function of methane concentration for an exemplary low-dielectric process.
Figure 11B:
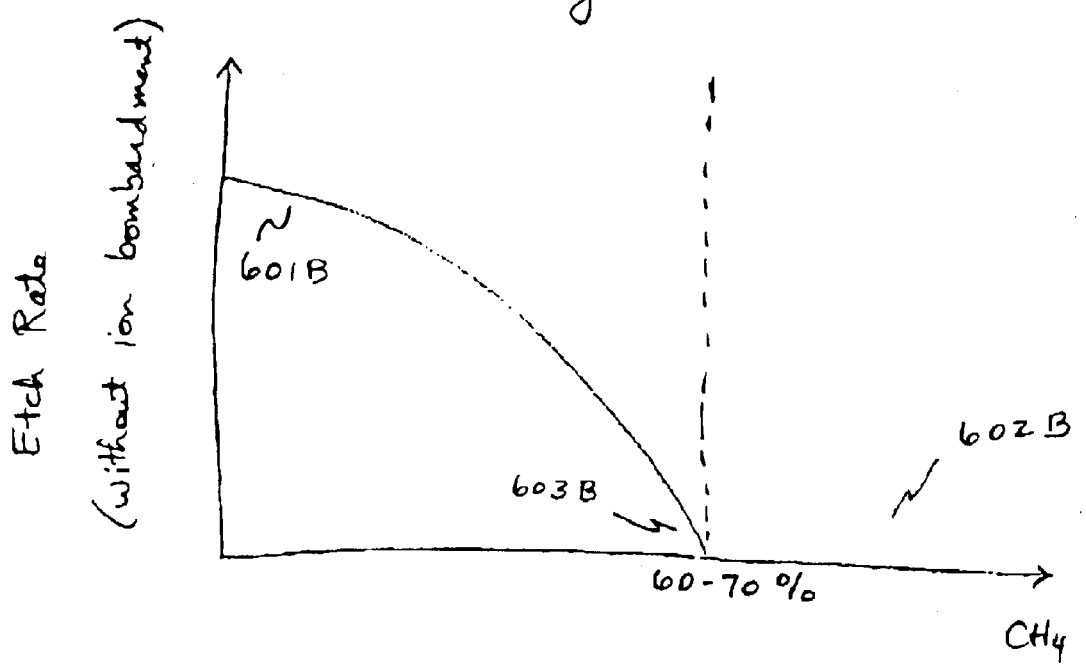

One approach for determining the ratio of the principal gas to the polymerizing gas will now be described with reference to FIGS. 11A and 11B. The horizontal axis for both figures is methane concentration (the amount of methane in the feedgas as a percent of methane plus oxygen). The vertical axis for both graphs is the total mass of material removed from the wafer's surfaces; in other words, etch byproducts coming from the wafer regardless of whether they originate from horizontal or vertical features. FIGS. 11A and 11B differ in that the etch of 11A is performed with RF power applied to the substrate pedestal which causes a DC bias. The process results shown in FIGS. 11A and 11B can be compared to estimate the amount of methane that will protect the sidewall and, at the same, time, allow anisotropic ion bombardment (with a DC bias) to etch horizontal surfaces.

It is clear from the figures that the etch rates would be maximized at locations 601A and 601B, since there is little or no polymerizing component of the feedgas. Consequently there is no polymer formation and no protective layer on horizontal surfaces. The other end of the spectrum lies at locations 602A and 602B. At 602B the methane concentration is at its maximum and there is considerable polymer formation on horizontal surfaces. Since there is no DC bias in FIG. 11B, the ions do not break through this layer and the etch rate approaches zero. In FIG. 11A, the DC bias causes more energetic ion bombardment and the polymer layer on horizontal surfaces is sputtered. The etch rate is low, but not zero.

A critical difference between the two situations (ion bombardment and no ion bombardment) occurs at a methane concentration of about 60 to 70 percent. No significant effect is seen at 603A, because the ion bombardment prevents a protective polymer layer from forming on horizontal surfaces. The majority of etch byproducts at 603A are emanating from horizontal surfaces since the vertical surfaces are protected. At 603B, however, just enough methane is present to prevent etching on both horizontal and vertical surfaces. This point is a good first approximation of the desired methane concentration. FIG. 11B shows that it is sufficient to protect vertical surfaces, while FIG. 11A shows that viable etch rates can be achieved for horizontal surfaces with a DC bias.

It turns out, however, that the amount of methane needed for sidewall protection may not be as high as indicated by this approximation. This is because the reaction products from the photoresist cause the gaseous phase above the wafer to contain enhanced amounts of both hydrogen and carbon (from the resist) and reduced amounts of oxygen radicals (since they have been consumed). The plasma chemistry become less oxidative, as if there were more methane in the feedgas. Once removal of the photoresist is complete, however, the plasma chemistry reverts to its composition based solely on the feedgases. It may be desirable, therefore, to use a smaller amount of methane initially and then increase it to ensure that the gas chemistry is not excessively oxidative at the completion of the etch. This may be accomplished with a two step recipe in which the second step has somewhat more methane relative to oxygen. The increased amounts of methane present at the time of photoresist clearing ensures that the sidewalls will not be attacked. More specifically, the methane proportion for a first step might be about 50 percent or less of the total flow, while that for the second step might approach as much as 70 percent.

For a specific exemplary low pressure process (between 2 mT and 10 mT), we have found that for any of the process steps (either pre- or post- endpoint) when the percentage of the total gas flow which is methane is about 50% to about 70% there is acceptably minimal or no etching of sidewalls.

The total flow of gas injected to the source is in the range of from about 50 SCCM to about 100 SCCM. In this process the amount of power supplied to the plasma source for any process step may be in the range of from about 1000 W to 2000 W. The power supplied to the pedestal for the bias is in the range of from about 75 W to 150 W for any step.

In the absence of a protective layer on the sidewall, such that the sidewall is indeed vulnerable to attack, the rate at which the sidewall is degraded depends not only on the strip rate (which in turn is a function of the number of oxygen or hydrogen radicals about), but also on the degree to which the surface of the wafer is covered by photoresist. When the photoresist strip rate is significant (i.e., greater than about several hundred angstroms/minute) and the surface coverage of the wafer is about 10 percent or more, the proportion of hydrocarbon in the gas flow may be reduced proportionally, based on the product of the strip rate and coverage area. The underlying mechanism is straightforward: there are sufficient carbon containing fragments originating from the etch byproducts of the photoresist being supplied to the plasma to reduce the need for a supplementary source as part of the feedgas.

The parameter decreases significantly as the etch reaches endpoint and the wafer clears (meaning that there is little photoresist remaining on the wafer). At this stage, it is preferable to have an immediate adjustment of the feedgas composition such that more methane is supplied to compensate for the lack of carbon in the plasma. A drawback of this adjustment, however, is a slowing of the photoresist etch rate as the new methane is added. It is preferable to begin the increased methane flow, with an appropriate margin of error, before the photoresist begins to clear. This suggests a two-step process with either a time limit for the first step, or the use of an endpoint detection system to signal the clearing of the photoresist and to cause the reactor to transition to the second (overetch) step.

Alternative embodiments may use gaseous feedstocks where the principal etchant includes nitrogen oxides, carbon dioxide, alcohols such as ethyl or methyl alcohol, and sulfur oxides. Additive gases may include alcohols, hydrogen diluted in inert gases such as helium, nitrogen or argon, ammonia, hydrocarbons including methane, ethane, propane, butane, ethene, acetylene, cyclic hydrocarbons including benzene, cyclohexane, cyclobutane.

Although the examples given above illustrated the principles of sidewall polymer formation with hydrocarbon containing feedgas compositions, giving rise to a carbon-based sidewall polymer, it will be appreciated that the protective layer may be a dense coating of silicon dioxide in other embodiments. In this case the additive gases would comprise a silicon-containing gas such as silane, disilane, methylated silane, TEOS, and TMCTS. With silicon-containing gases, however, there is a potential for complete suppression of photoresist etching due to the accumulation of silicon on the exposed surface of the photoresist. This can be remedied by including small amounts of fluorine-containing gases in the injected mixture, such as nitrogen trifluoride, difluoromethane, trifluoromethane, hexafluoroethane, and other fluorocarbon gases.

Higher sidewall polymerization rates to protect against oxidation may be desirable for some materials with greater sensitivity to oxygen. Such higher sensitivity materials may favor use of silicon containing additive gases which provide better sidewall protection. Examples of such sensitive materials may include HOSP or Nanoglass, both of which are highly permeable to oxygen atoms which tend to degrade the internal structure of the material by oxidation of hydrogen and carbon.

The above exemplary low-k processes may be performed in an inductively-coupled plasma reactor. Exemplary pressures for such a reactor are generally less than 1 Torr and may range, for example, from about 2 to 200 mTorr. The plasma source power may range, for example, from a few hundred watts up to about 5 kilowatts. The pedestal biasing power may range, for example, from about 0.1 to about 2 watts/cm$^2$.

For a capacitively coupled source, exemplary pressures may range from about 5 mTorr to a few Torr. The higher pressure ranges of such capacitive coupled plasmas may dictate interelectrode spacings of a few centimeters or less, so that the ion current density is sufficient to provide the requisite activation energies. A typical excitation power for a capacitively coupled source may be less than about 3 watts/cm$^2$, so that an adequate ion flux may be realized.

A. MSSO/Si—O—C (—H) Low-K Materials

Process considerations for specific types of low-k materials will now be discussed. The low-k materials that are most sensitive to the oxidative conditions of conventional plasma stripping chemistries are the silicon and oxygen-containing dielectrics methyl silsesquioxane (MSSQ) and silicon and carbon containing CVD materials such as SiOC and SiOCH. For this class of materials it is important to minimize the use of oxygen, although oxygen may be used in small amounts in some embodiments. To maintain an appreciable strip rate, the feedgas comprises a substantial amount of hydrogen which is diluted to about 10 percent or less of the total flow in inert gas such as nitrogen, or any of the noble gases. The feedgas may have small amounts of additive gases such as ammonia, methyl alcohol, methane or water vapor and possibly fluorine containing gas such as $C_2F_6$, $CHF_3$, and $CH_2F_2$. If oxygen is included, it will typically have a flow rate that is less than about half the flow rate of the polymerizing component (e.g. methane).

In exemplary embodiments, photoresist stripping with exposed surfaces of MSSQ or Si—O—C (—H) CVD materials takes place with a wafer temperature less than about 100 degrees Celsius. The low temperature allows for the formation of a hydrocarbon polymer on the surface of the low-k material, because it is easier for the atoms comprising the protective layer to condense on a colder surface. Temperatures above about 100 degree Celsius may discourage the formation of the polymer.

An exemplary gas composition for MSSQ/SiOC processes comprises a mixture of three or more gases such as ammonia, methane and oxygen, or these same gases with an inert diluent such as helium or nitrogen. The reactor pressure may range, for example, from about 2 mTorr to 200 mTorr, with a total gas flow of between about 10 and 1,000 SCCM. The plasma source RF power may range, for example, from about 100 to 2,000 watts. The power to bias the wafer may, for example, range from about 25 to 300 watts, which translates to a density of about 0.1 and 1.0 watts/cm$^2$, respectively.

An alternative embodiment of the MSSQ/SiOC process may use principally hydrogen gas (diluted to about 10% in an inert gas) with substantially no oxygen. The exemplary pressure may be less than a few hundred mTorr with a total flow rate of less than a few thousand SCCM. In this embodiment, the wafer temperature may exceed 100 degrees Celsius. The ion bombardment still provides part of the activation energy for chemical reactions but is not the exclusive source since there is some thermal contribution.

Another embodiment of the MSSQ/SiOC process uses a modest flow of oxygen, about 50 SCCM or less, along with a smaller amount of plasma source power. In this embodiment the source power may be about 500 watts or less. The biasing power to the wafer pedestal may be larger, about 75 watts, and the pressure may be about 5 mTorr. The purpose of this variation is to enhance the formation of an $SiO_2$ based protective layer. The loss of low-k material may be monitored by a decrease in the Si—C peak height from an FTIR (Fourier transform infrared) diagnostic, and in this case the peak decreases only about 5 percent over a one minute period. The strip rate remains at an economically impressive level, however, of almost 5,000 angstroms/minute.

The mechanism underlying this embodiment of the MSSQ/SiOC process involves a protective layer on the low-k dielectric, as before, but in this case the layer is thought to comprise a dense silicon dioxide barrier. Ultraviolet radiation from the plasma may cause further degradation of the MSSQ material, possibly by breaking bonds of methyl group to silicon. It may be that the hard mask (or cap layer) comprising silicon nitride, dioxide, or oxynitride overlying the low-k material is affording additional protection from the plasma UV.

Yet another embodiment of a MSSQ/SiOC process uses a two-step process, where a dense and impermeable protective layer comprising mainly silicon dioxide or oxynitride is formed on the low-k sidewalls in the first step. The barrier may be as thin as 100 angstroms. There are two variations that may be used for the first step which are referred to as Version A and Version B below.

Version A of the first step demonstrates a substantially lower isotropic etching rate for photoresist or MSSQ or Si—O—C (—H) materials due to a great preponderance of hydrogen and/or hydrocarbons over oxygen in the processing gases. In this type of first step there is modest deposition of hydrocarbon polymers on the sidewalls of the trenches or vias, and a moderate strip rate of the photoresist due to direct ion bombardment. The ions of this flux have energies of about 100 eV or less. Exemplary conditions that lead to polymer deposition on the sidewalls are: a methane and oxygen flow rate of about 40 and 20 SCCM, respectively; a gas pressure of about 5 mTorr; a plasma source power of about 2,000 watts, and an RF power to the wafer pedestal of about 75 watts. The photoresist etching rate for this. version of step 1 is about 2,000 angstroms/minute.

Version B of the first step uses more oxygen than version A (though not at high flow rates), and, in some embodiments, a lower plasma source power. The composition of the sidewall protective layer is based on silicon dioxide. The bias power may be higher than that usually used for photoresist stripping. Exemplary conditions are: a total gas flow of about 100 SCCM or less, of which about 30 SCCM or less is oxygen (the active component); a gas pressure of 2 to 10 mTorr; a plasma source power of about 100 to 2,000 watts; and an RF power density to the wafer pedestal of about 0.1 to 1.0 watts/$cm^2$.

Both versions of step 1 can contain admixtures of other gases such as ammonia, silane or other silicon-containing gases, methyl or ethyl alcohol, water vapor, nitrogen or nitrogen oxides, carbon dioxide, and methane. An exemplary gas composition is oxygen (principle gas) and silane (additive gas), which may be delivered from a dilute mixture with inert gas. The sidewall layer in this exemplary case would comprise silicon dioxide, and a layer as thin as 100 angstroms poses a formidable barrier to oxygen diffusion.

The purpose of the second step of this embodiment is to rapidly remove the photoresist, so a less depositing gas composition is desired. A slight amount of etching of the sidewall protective layer may be tolerated in the second step. The feedgas is either a substantially hydrogen-based mixture, or a blend containing a greater amount of oxygen than was used in the first step. Hydrogen (and/or ammonia) is again used with an inert diluent such as helium or nitrogen, and may contain additives such as water or alcohols. If an oxygen/methane combination is employed, the oxygen flow can approach or even exceed that of the methane. A rich oxygen mixture may be used especially in the case where the protective sidewall layer is substantially silicon dioxide (step 1, version B).

The remaining conditions for the second step of this two-step process for MSSQ and Si—O—C (—H) CVD materials are: a total gas flow of between 10 and 1,000 SCCM; a reactor pressure between 2 and 200 mTorr; a plasma source power of between 200 and 2,000 watts, and an RF power density to the wafer pedestal of about 0.1 to 1.0 watts/$cm^2$.

Exemplary process conditions for the MSSQ/SiOC class of materials are summarized in FIGS. 12 and 13.

An alternative embodiment forms a protective layer of dense silicon dioxide, not by condensation of a precursor gas, but rather by sputtering from a solid source (target) that is located within reactor. The source may be, for example, the reactor walls themselves, which would be fabricated from quartz. The method involves capacitively coupling energy to the plasma, and using the resulting ion bombardment of the reactor walls to sputter off the silicon dioxide. The method is feasible even in the case of an inductively coupled plasma, since there is always a capacitive component from the coils through the reactor walls (in the absence of complete shielding). The silicon dioxide layer is deposited in a first of two steps, as in the previous embodiment, with the second step employing substantial amounts of oxygen and little or no hydrogen, carbon or silicon to provide a rapid etching of the remaining photoresist. Remaining process conditions for the second step are: an oxygen flow between 30 and 100 SCCM, a pressure of 5 mTorr; RF power to an inductively coupled plasma source of 1,000 to 2,000 watts, and an RF power to the wafer pedestal of 50 to 150 watts.

B. Non-Carbon Silsesquioxane Low-K Materials

The processing latitude of silsesquioxanes that do not contain carbon is wider than that for the silicon-containing materials discussed above. Examples of silsesquioxanes that do not contain carbon are the branched and caged structures of hydrogen silsesquioxane (HSQ). The caged version of HSQ (from DuPont) is better known as "flowable oxide," or FOx™.

Greater amounts of oxygen may be used when processing HSQ and FOx, and the gas composition may be substantially oxygen, but care should be taken to maintain the wafer temperature at less than about 100 degrees Celsius to avoid oxidation of the low-k material. Exemplary processing conditions for HSQ and FOx are: a total gas flow of less than about 1,000 SCCM, a pressure of about 2 to 200 mTorr; RF power to the plasma source of about 200 to 2,000 watts, and a bias power to the wafer pedestal of about 0.1 to 1.0 watts/$cm^2$. Since the HSQ and FOx materials have a wide processing latitude, the exemplary processes outlined above for the MSSQ and CVD Si—O—C(—H) materials may be used as well.

C. Organic Low-K Materials

Turning to the organic low-k materials, the difficulty here is clear: both the low-k material and the photoresist are organic polymers with roughly the same elemental constituents (which may be modeled stoichiometrically as $C_nH_n$). This problem is addressed by utilizing a mixture of gases in the plasma such that the etching rates of organic materials, which includes both the photoresist and the low-k dielectric, are very low in the absence of ion bombardment, and greater than about 1,000 angstroms per minute when ion bombardment is present. In this case the sidewall of the low-k material is not etched because of the directionality of the ions, but this does not preclude the use of either a silicon or hydrocarbon-based protective layer.

The choice of gases that that makes this possible are one or a combination of the following: hydrocarbons including methane, ethane, propane, butane, small cyclic hydrocarbons including cyclobutane, pentane and hexane, benzene, methanol, ethanol, propanol; carbon dioxide, hydrogen, nitrogen, ammonia, silane, disilane or TEOS, water vapor, formaldehyde, acetaldehyde, ethylene oxide, or other light, volatile organic compounds with modest oxygen content, and oxygen. Oxygen flow may be less than 50 percent of the total flow, such that the mixture of radicals produced by the source is dominated by reducing species such as atomic hydrogen or hydrocarbon radicals. An exemplary feedgas mixture is water and methane, in which the methane flow is somewhat higher than that of the water vapor. A second exemplary feedgas is pure methanol. A third example of a feedgas mixture is oxygen and ethane, in which the ethane is the majority component. In each of these examples of gas combinations the relative proportions of the different vapors or gases are such that the overall composition is substantially net reducing in chemical action.

The gas flow for each of the above mentioned compositions may be less than about 1,000 SCCM in an exemplary embodiment. The gas pressure in the source is from about 1 mTorr to as much as 200 millitorr, and the amount of power supplied to the plasma source is in the range between 200 and 2,000 watts so that the ion current density is about 0.3 mA/cm$^2$ or more. The power provided to bias the pedestal is also in the range from 0.1 to 1.0 watts/cm$^2$. Slight differences in the optimum gas pressure may apply for the different types of plasma sources: whereas the pressure with an inductively coupled source might be about 200 mTorr, microwave-based or capacitively coupled plasma sources use modestly higher pressures depending on whether diluent gases such as helium are used.

In keeping with the principles already discussed, a two-step process may be used to strip photoresist in the presence of an organic low-k dielectric. An exemplary set of conditions for the first step uses an inductively coupled plasma source operated between 2 and 10 mTorr at about 2,000 watts of power, with slightly less than 100 SCCM of feedgas comprising about two parts water vapor and one part methane. Alternatively, the feedgas may comprise one third oxygen and two thirds methane. The wafer support pedestal may be biased with approximately 100 watts RF power at 13.56 MHz. The gas composition may become slightly higher in oxygen (perhaps 60 percent methane and 40 percent oxygen) for a second process step, such that the photoresist etch rate increases to more than 2,000 angstroms/minute.

D. Additional Low-K Processes and Residue Removal

In the case of some low-k materials which have substantial silicon content the stripping process may be able to be done without the need for polymerization on the low-k sidewall, even while using an oxygen-dominated gaseous feedstock. Plasma source and bias conditions for such processes may be within the same ranges as for the just-discussed processes in which sidewall polymers are required. Some such materials are less sensitive such that for low pressure conditions in the plasma source may, even while using pure oxygen gas, yield sufficient ion flux relative to oxygen radical flux that the sidewalls of the low-k material have formed on them a substantially impermeable silicon dioxide layer. This has been observed with an inductive plasma source at pressures less than 10 mTorr with low to moderate plasma source power (less than about 1 kW) and moderate to high bias power to the wafer pedestal (0.25 to 1.0 Watts per squared centimeter) for such low-k materials as FOX (Dow), HSQ (Allied-Signal), Black Diamond (Applied Materials), HOSP (Allied Signal), and HSG (Hitachi Chemical).

For these and other similar materials which may be more permeable (such as Nanoglass), to form such a dense sidewall layer at the low-k surfaces may require addition of gases which help to seal such sidewalls against oxygen or other etching radical permeation. Such materials may be so sensitive to such permeation that they must include a pre-etch step which uses predominantly a depositing gas with very little or no oxygen or other etchant gas so as to form a sealing layer on all exposed surfaces. One embodiment of such a gas mixture might include silane with a minimal amount of oxygen-containing gas so as to form a silicon dioxide layer on the low-k sidewall. Once this impermeable protective layer is formed on the low-k surfaces then a second process step may proceed which uses substantially oxygen or other aggressive etching gas mixture to permit rapid removal of the remaining photoresist. The amount of such depositing gases employed may be very small and/or the time for such depositing step may be small (<30 seconds) since protective layers need to be only 100 Angstroms thick if they are of good density. If a silicon containing deposit has been formed on the photoresist in the first step then it may be necessary to add a small amount of fluorine or other silicon etchant to the gas mixture, at least briefly, so as to clear away that layer obstructing photoresist etching. This may be done with small admixtures of fluorine containing gases so as not to etch off the sidewall protective layer which was just formed. This is possible because the etching rate on the sidewall is much less due to the substantial absence of ion bombardment. Once the photoresist is exposed in such a process step there may be a third step in which fluorine is absent and oxygen predominates and the photoresist etching is allowed to proceed to endpoint and through some overetch. It may be required at this point to remove the sidewall protective layer and/or sidewall residues which were deposited in preceding steps and processes. In this case residue removal steps should be employed which are detailed below.

Once the photoresist is finished being etched, the residues which includes those created prior to photoresist etching as well as during the photoresist etching, need to be removed. This should be done with a recipe which does not cause damage to the sensitive low-k material, or sputter other materials such as copper which may be exposed during this process. Yet this step or steps of the process should substantially reduce or treat those residues so as to minimize or even eliminate the wet processes using caustic, acidic or solvent type chemicals.

One of the requirements for some processes with exposed copper is that it sputter less than 100 Angstroms of copper. In some cases it may be required that virtually no copper be sputtered. Such a process step for cleaning might use predominantly hydrogen gas in a mixture with an inert gas such as helium. Hydrogen is capable of reacting with metallic oxide and fluoride compounds as well as silicon oxide or silicon fluoride polymers to break some of the bonds with oxygen and fluorine and create more easily removed (or even volatile) compounds such as metallic or silicon hydrides or hydroxides. It is also possible to add some fluorine to the gas injected for the last step so as to have extra reactivity with hard polymer compounds, particularly when exposed areas of aluminum, or titanium are present on the wafer.

Some processes involve removing residues containing inorganic compounds, possibly including Silicon or metals, from the exposed surfaces of the hard mask or dielectric layer which covers the low-k material such as in the "Dual Damascene" structure. In these processes the process gas combination might contain very little or no Oxygen, but rather more Hydrogen or its compounds, so as to permit chemical attack of the residues with activation energy provided by the ion bombardment. In the case of substantially organic low-k there would be very little or no Oxygen included to cause minimal chemical reaction with the exposed sidewall of low-k material. If using Silicon-based low-k there would be a small amount of Oxygen needed, perhaps provided to some degree by material etched from the hard mask. Finally, there might be metal or Silicon containing residues which line the sidewalls of the vias or trenches and which need to be removed to produce functional devices. Such residues are likely to be chemically converted with the aid of ion bombardment, as are more exposed residues, but require more ion flux to the wafer since they receive the ion impact mostly "edge-on" and therefore present effectively a much thicker target. Such residues might occur in both Silicon-based low-k and pure organic low-k technologies. In both cases there would be little or no Oxygen used and mostly Hydrogen or Hydrogen-containing gases, but in the Silicon-based case some Oxygen is required to promote the formation of the hard, dense Silicon Dioxide passivation layer.

A very specific example of an actual process condition and gas recipe which might be used for both photoresist etching and residue removal is the following:

In general, many via residues containing metal will require higher bias power for treatment whereas photoresist removal will require less.

E. Low-K Processes After Via Etch. Use of Liner

In a typical via etch, the via is etched to endpoint on the underlying metal lines prior to photoresist removal. As described above, this may expose metal (such as copper) during the photoresist removal process which can be disadvantageous. In such cases, the process parameters may be controlled to reduce sputter as described above, but this may also reduce the rate of processing.

In other embodiments of the present invention, the via etch does not penetrate the dielectric all the way through to the metal lines. Rather, a thin "liner" of dielectric material (usually silicon nitride or oxynitride) remains over the metal lines. As a result, the metal is not exposed during photoresist and residue removal. The liner is then removed in a subsequent etch step. The exposed metal surface is then cleaned to remove residues (usually containing carbon, fluorine, silicon and oxygen) that remain on the metal surface and on the via sidewalls. It is desirable to leave clean unoxidized metal (which may be copper) on the surface exposed at the base of the via so good electrical contact can be made to the conducting line.

Below are described exemplary processes for photoresist and residue removal after via etching in the presence of low-k dielectric materials. In general, the overall exemplary process may involve a combination of one or more of the following steps: photoresist removal, residue removal, liner etching and metal surface cleaning. The exemplary process parameters described above for various low-k materials may be used within the context of this overall process. Additional examples and descriptions are also provided below. It is noted that, when a liner remains, the photoresist and residue removal steps may be more aggressive than when copper is exposed.

| Step # | Pressure | ICP power | Bias power | process time | oxygen flow | methane flow | $H_2$/Helium flow |
| --- | --- | --- | --- | --- | --- | --- | --- |
| 1 | 5 mT | 2 kW | 75 W | 60 sec | 30 SCCM | 30 SCCM | 0 SCCM |
| 2 | 5 mT | 2 kW | 75 W | 60 sec | 20 SCCM | 40 SCCM | 0 SCCM |
| 3 | 5 mT | 2 kW | 100 W | 30 sec | 0 SCCM | 0 SCCM | 100 SCCM |

One additional benefit of the above process recipe is that the use of hydrogen in the last step causes the reduction of metallic oxide on the surface of the metal line located at the base of the via. There is often a layer of copper or aluminum oxide and/or fluoride covering the surface due to the reactions of the etchant gases used in the preceding dielectric etch step with the metal after the endpoint of that etch. The oxides and/or fluorides are less electrically conducting than the metal itself and hence may cause increased circuit resistance which slows down the transistor switching speeds and hence the circuit speed as a whole. It is, therefore, highly desirable to reduce the oxide or fluoride and leave the surface of the metal in a pure state. The use of hydrogen is very beneficial since it is capable of reducing oxides and fluorides and forms stable gaseous compounds with the oxygen and fluorine (OH and HF respectively) which can be pumped out of the system. The energy of the hydrogen ions and helium ions is such as to provide activation energy for breaking bonds in the oxide or fluoride and thus promoting chemical reactions of the hydrogen with the oxygen and fluorine.

This embodiment of the invention may be used, for instance, on single or dual damascene-type structures and is particularly desirable when copper is used for the interconnect lines. The processes described below may be used, however, whether copper or another metal is used for interconnect lines.

Photoresist Removal. The photoresist removal step may vary depending upon whether silicon-based low-k dielectrics or carbon-based low-k dielectrics are used.

(i) Silicon-Based Low-K Dielectrics. The following exemplary process may be used for removal of photoresist in the presence of low-k dielectrics which have substantial silicon content, such as HOSP (from Allied Signal), Spin-on Glass (Hitachi HSG-7), and "Black Diamond" from Applied Materials, and other plasma CVD films made with methylated silane. An inductively coupled plasma reactor with a relatively low inductive power level, a moderate bias power to the pedestal, and a low pressure oxygen-based gas may be used. Exemplary conditions are: 5 mTorr pressure, 50 SCCM Oxygen flow, 150 Watts bias power for a 200 mm diameter wafer, and 400 to 500 Watts of RF power to the inductively coupled source. Dilution with argon or nitrogen tends to diminish results. Results are optimized using FTIR spectroscopy to measure silicon-methyl bond survival after process. This process provides photoresist removal rates up to 6000 Angstroms per minute while causing only slight reduction in the FTIR peaks for the critical bonds in these materials (e.g.,<10%).

The above conditions may be successful because the lower ICP power gives reduced radical concentrations and reduced UV light production in the source. UV light can be harmful to such materials presumably because it causes methyl to silicon bond breakage and possibly other damage to the material. Oxygen atoms may also be harmful to the materials since they oxidize the methyl groups very aggressively. We believe that this plasma has a higher concentration of molecular oxygen ions as compared with atomic ions and causes less oxidation of the low-k materials.

This process forms (by oxidation during photoresist removal) a silicon dioxide protective layer (<200 A thick) on the sidewall of the via protecting the low-k material. We have measured this protective layer after processing blanket low-k films of this type using the above described stripping process. We measured its composition and thickness using the diagnostic method of Secondary Ion Mass Spectroscopy to be between 100 A and 200 A thick containing almost exclusively silicon and oxygen with the carbon almost entirely depleted.

(ii) Carbon-Based Low-K Dielectrics. Carbon-based materials, such as FLARE (Allied-Signal), SiLK (Dow) or Parylene, have greater similarity to photoresist itself. As a result, it may be desirable to use anisotropic ion bombardment to activate the photoresist removal while sparing the exposed sidewalls. Below are described two exemplary processes.

In the first exemplary process, a polymerizing gas such as methane along with oxygen (up to about 50 SCCM) is used in a two step process. In the first step, a ratio of about 1:1 methane to oxygen is used and, in the second step, a ratio of about 2.5:1 methane to oxygen is used. A pressure of about 5 mTorr (more generally, between about 3 mTorr and 10 mTorr) with a slight to moderate bias on the pedestal (less than or about 100 Watts for a 200 mm diameter) is used.

In the second exemplary process, a moderate to dilute mixture of hydrogen gas in helium (from 4% to about 20%) or other inert gas is used. Minor amounts of carbon containing gas may be added to the dilute hydrogen to prevent attack on the exposed low-k material.

In both of these processes the wafer temperature is kept low so as to minimize the attack on the organic material by either the oxygen or hydrogen radicals. For example, the wafer temperature may be maintained at less than 70 Celsius, with lower temperatures being desirable.

The first, and possibly the second, of these processes may use two or more steps in order to prevent attack on the low-k material since the plasma chemistry will be less polymerizing after the photoresist is removed. In the second step, the plasma is made more polymerizing by increasing the proportion of carbon containing gas before endpoint to prevent isotropic etch of the low-k material.

For removal of photoresist, the oxygen-based process has higher rates of etching than the hydrogen-based process. We have seen that for either process gas option there is a tendency to isotropically etch the low-k material unless the temperature is kept low, and the plasma chemistry is sufficiently polymerizing to protect the exposed sidewalls of the low-k material. In order to tolerate this chemistry change at photoresist endpoint the Residue Removal. The residue removal step may vary depending upon whether silicon-based low-k dielectrics or carbon-based low-k dielectrics are used.

(i) Silicon-Based Low-K Dielectrics. When this is done prior to etching the liner (thus exposing the metal) but after removal of the photoresist the typical residues contain both carbon and silicon as well as other more volatile elements. In order to remove such residues it may be necessary to add some fluorine containing gas such as $C_2F_6$ (or other fluorocarbon or fluorine containing gas) in a small amount to the gas mixture. The amount is such as to promote removal or conversion to soluble form of the residues while not causing significant etching of the silicon-based low-k material. The predominant gas for the residue removal may be oxygen or hydrogen depending in part on how much time is required for residue removal. The longer the time the more likely that low-k etching or oxidative degradation will occur when oxygen/fluorine chemistry is employed. When Hydrogen is used, it may be in a diluted form (from 4% to 20%) mixed in Nitrogen, Argon or Heliumn.

In cases where the liner has already been etched and therefore the residues may contain sputtered metal atoms it may be preferable to use either of the chemistries mentioned but with reduced bias power so as to minimize sputtering of the exposed metal. Use of the hydrogen/helium mixture is beneficial in that it reduces the sputtering by virtue of the low mass of the ions.

Exemplary process parameters for an oxygen-based process may be: 5 mTorr (more generally from 3 mT to 50 mT), 30 SCCM Oxygen flow (more generally from 5 SCCM to 100 SCCM), bias power of 150 Watts for a 200 mm diameter pedestal (more generally from 50 W to 300 W) with plasma source power of 400 W (more generally from 100 W to 1000 W).

Exemplary process parameters for a hydrogen-based process may be: 10 mTorr (more generally from 5 mT to 500 mT) with the total hydrogen forming gas flow of 200 SCCM and the percentage of hydrogen from about 4% to 20%. The hydrogen forming gas may use Helium as the main inert constituent so as to reduce the sputtering rate of exposed metal. The bias power may be 150 Watts for a 200 mm wafer (more generally from 50 W to 500 W). Typically a higher bias power is used when operating at higher pressures. The plasma source power may be 1500 W (more generally from 500 W to 2000 W). This process may be performed in two steps, with the fluorine containing gas omitted in the first step. The duration of the first step may be from several seconds to several minutes. In some situations there may be a concern about the amount of exposed dielectric etched in this process step-in this case the bulk of this process may be done in the first step which may use no fluorine containing gas. The second step may be short and use a minimal amount of fluorine containing gas (e.g., as little as one SCCM in some cases).

The exemplary processes should convert the residues to soluble or volatile form while not breaching the silicon oxide protective layer on the sidewall of the via covering the low-k material. This protective layer may be formed by oxidation of a thin layer of the low-k during the photoresist removal as discussed above. Use of the hydrogen-based process may cause slower erosion of this protective layer and therefore be preferred in some cases. Even when the layer is breached in the hydrogen process it may be less damaging since the reactivity of the hydrogen with the low-material is less than that of oxygen atoms.

(ii) Carbon-Based Low-K Dielectrics. When this residue removal is done prior to etching the liner (thus exposing the metal) but after removal of the photoresist the typical residues probably contain mainly carbon and a small amount of silicon as well as other more volatile elements. In order to remove such residues it may be necessary to add some fluorine containing gas such as $C_2F_6$ (or other fluorocarbon or fluorine containing gas) in a small amount to the gas mixture. The amount is such as to promote removal or conversion to soluble form of the residues while not causing significant etching of the low-k material. The predominant gas for the residue removal may be hydrogen. The use of the hydrogen is in a diluted form (from 4% to 20%) in which it is mixed in Nitrogen, Argon or Helium.

In cases where the liner has already been etched and therefore the residues may contain sputtered metal atoms, it may be desirable to use a reduced bias power so as to minimize sputtering of the exposed metal. Use of a hydrogen/helium mixture is beneficial in that it reduces the sputtering by virtue of the low mass of the ions.

This exemplary process does not use oxygen (or any gas containing substantial oxygen) as a significant constituent of the mixture since atomic oxygen attacks such dielectrics aggressively. Since the purpose is to clean the residues, polymerizing gases which deposit polymer on the via sidewalls are not used to prevent oxidation. Therefore, a predominantly hydrogen-based process may be required. Exemplary parameters for such a process are: 10 mTorr (more generally 5 mT to 500 mT) with 200 SCCM of 10% hydrogen mixed in helium (more generally from 50 SCCM to 2000 SCCM) with bias power of 150 Watts for a 200 mm wafer (more generally between 30 W and 400 W) and plasma source power of 500 W (more generally between 200 W and 2000 W)

The purpose of the process is to treat residues without attacking the low-k material if possible. The hydrogen-based process may chemically react with such residues whether they contain silicon or carbon and convert them to volatile form. It also does not have a high rate of isotropic etching of the low-k material when the temperature of the sample is kept at or below about 100 Celsius.

Liner Etching Process. The liner etch process may vary depending upon whether silicon-based low-k dielectrics or carbon-based low-k dielectrics are used.

(i) Silicon-Based Low-K Dielectrics. The liner, which is most often made of Silicon Nitride or Oxynitride, may be etched by a gas mixture including some Fluorine containing gas and may also contain some oxygen or hydrogen. An RF bias may be applied to the pedestal so that the liner (which may be about 1000 Angstroms thick) is etched at a cost effective rate. During this etch the low-k material should not be degraded or etched isotropically, nor should the metal underlying the liner be sputtered once the etch is endpoint. Therefore, the bias power provided to the pedestal should be reduced once the underlayer is exposed. For this reason, a two-step process may be desirable. The first step is at a higher bias and etches the material faster. The second step (which begins shortly before the liner is penetrated) is at lower bias power so that the ions do not sputter the exposed metal (especially copper). It may also be beneficial if prior to the liner etch the plasma source is operated with oxygen while the bias power is high enough to cause some sputtering of the liner material. This has the benefit of causing the silicon oxide layer at the surface of the low-k material on the via sidewall to become slightly thicker and thereby a better barrier to potential oxidation which might occur during the liner etch process.

Etching of the liner may take place in two or more steps and may employ either oxygen or hydrogen as a complementary gas to the fluorine-containing gas.

The following are exemplary parameters for an initial, optional process step: 5 mTorr pressure (more generally from 1 mTorr to 200 mTorr), with oxygen flow of 10 SCCM (more generally from 2 to 200 SCCM), bias power of 200 Watts (more generally from 25 W to 500 W) and plasma source power of 500 Watts (more generally from 250 W to 1500 W). This step may be followed by a two step oxygen or hydrogen based process.

An exemplary oxygen-based process is as follows:

(Step 1) 5 mTorr pressure (more generally from 1 mTorr to 200 mTorr), with $C_2F_6$ flow of 40 SCCM and oxygen flow of 10 SCCM (more generally from 10 SCCM of $C_2F_6$ to 200 SCCM, and 2 SCCM oxygen to 50 SCCM), bias power of 200 W (more generally from 100 W to 500 W) and plasma source power of 500 W (more generally from 250 W to 2000 W).

(Step 2) 5 mTorr pressure (more generally from 1 mTorr to 20 mTorr), with $C_2F_6$ flow of 40 SCCM and oxygen flow of 10 SCCM (more generally from 10 SCCM of $C_2F_6$ to 200 SCCM, and 2 SCCM oxygen to 50 SCCM), bias power of 50 W (more generally 20 W to 100 W) and plasma source power of 1500 W (more generally 1000 W to 2000 W).

An exemplary hydrogen-based process is as follows:

(Step 1) 20 mTorr pressure (more generally from 5 mTorr to 200 mTorr), with $C_2F_6$ flow of 40 SCCM and hydrogen forming gas (e.g., 10% hydrogen in Helium) flow of 100 SCCM (more generally from 10 SCCM of $C_2F_6$ to 200 SCCM, and 20 SCCM hydrogen to 1000 SCCM), bias power of 200 W (more generally 100 W to 500 W) and plasma source power of 500 W (more generally 250 W to 2000 W).

(Step 2) 40 mTorr pressure (more generally from 8 mTorr to 200 mTorr), with $C_2F_6$ flow of 20 SCCM and hydrogen forming gas (e.g., 10% hydrogen in Helium) flow of 100 SCCM (more generally from 10 SCCM of $C_2F_6$ to 200 SCCM, and 20 SCCM hydrogen forming gas to 1000 SCCM), bias power of 50 W (more generally 20 W to 100 W) and plasma source power of 1500 W (more generally 1000 W to 2000 W) where the bias voltage is held to less than or equal to about 25 Volts so as to eliminate sputtering of the copper exposed at the bottom of the vias.

Desirable features for these exemplary liner etch processes are:

1) To etch it anisotropically which requires ion bombardment, and at the same time not to isotropically etch the sidewall of the low-k material such that the silicon dioxide layer on its surface is breached permitting oxidation of the low-k material.

2) To avoid ion energies above the sputter threshold as the liner is being etched through, so that substantially no copper atoms are sputtered up onto the sidewall of the via. Such copper would be able to diffuse through the dielectric causing eventual failure of the circuit due to poisoning of the semiconductor material. During this step it is also desirable to avoid isotropically etching the protective oxide layer on the sidewall of the low-k dielectric so that the material in the interior is not exposed to the reactive species during the liner etching.

The first requirement is mostly met during the first step of the process while the second requirement must be met during the second step. It is desirable that no copper be exposed during the first step when the higher ion energy would cause sputtering of the copper. This means that the remaining thickness of the liner should not be too variable from one area of the wafer to another or from one wafer to another. When such is the case it would be necessary to use only the lower ion energy second step for the entirety of the liner etching process so as to avoid sputtering. The lower ion energy in this step will result in longer etching time due to its lower etching rate.

(ii) Carbon-Based Low-K Dielectrics. The liner, which is most often made of Silicon Nitride or Oxynitride, may be etched by a gas mixture including some Fluorine containing gas and may also contain some hydrogen or hydrogen containing gas mixture but not any substantial amount of oxygen. An RF bias may be applied to the pedestal so that the liner (which is about 1000 Angstroms thick) is etched at a cost effective rate. During this etch the low-k material should not be etched isotropically, nor should the metal underlying the liner be sputtered once the etch is endpointed. Therefore, the bias power provided to the pedestal should be reduced once the underlayer is exposed. For this reason, a two-step process may be used as with the silicon-based dielectric. It may also be beneficial if prior to the liner etch the plasma source is operated with a very small amount of silane. This has the benefit of forming a silicon oxide layer at the surface of the low-k material on the via sidewall that is slightly thicker and thereby a better barrier to potential oxidation which might occur during the following liner etch processes. Generally, such a protective covering layer should be formed if oxygen gas will be used in the mixture for the liner etch process.

Etching of the liner may take place in two or more steps and may employ either oxygen or hydrogen as a complementary gas to the fluorine-containing gas. A hydrogen-based gas may be particularly desirable for this process.

The following are exemplary parameters for an initial, optional process step: 5 mTorr pressure (more generally from 1 mTorr to 200 mTorr), with silane flow of 10 SCCM (more generally from 2 to 200 SCCM), bias power of 200 Watts (more generally from 25 W to 500 W) and plasma source power of 500 Watts (more generally from 250 W to 1000 W). This step may be followed by a two step hydrogen or oxygen based process.

An exemplary hydrogen-based process is as follows:
(Step 1) 20 mTorr pressure (more generally from 5 mTorr to 200 mTorr), with $C_2F_6$ flow of 40 SCCM and hydrogen forming gas (e.g., 10% hydrogen in Helium) flow of 100 SCCM (more generally from 10 SCCM of $C_2F_6$ to 200 SCCM, and 20 SCCM hydrogen to 1000 SCCM), bias power of 200 W (more generally 100 W to 500 W) and plasma source power of 500 W (more generally 250 W to 2000 W).

(Step 2) 40 mTorr pressure (more generally from 8 mTorr to 200 mTorr), with $C_2F_6$ flow of 20 SCCM and hydrogen forming gas (e.g., 10% hydrogen in Helium) flow of 100 SCCM (more generally from 10 SCCM of $C_2F_6$ to 200 SCCM, and 20 SCCM hydrogen forming gas to 1000 SCCM), bias power of 50 W (more generally 20 W to 100 W) and plasma source power of 1500 W (more generally 1000 W to 2000 W) where the bias voltage is held to less than or equal to 25 Volts so as to eliminate sputtering of the copper exposed at the bottom of the vias.

An exemplary oxygen-based process is as follows:
(Step 1) 5 mTorr pressure (more generally from 1 mTorr to 200 mTorr), with $C_2F_6$ flow of 40 SCCM and oxygen flow of 5 SCCM (more generally from 10 SCCM of $C_2F_6$ to 100 SCCM, and 2 SCCM oxygen to 20 SCCM), bias power of 200 W (more generally 100 W to 500 W) and plasma source power of 500 W (more generally 250 W to 2000 W)

(Step 2) 5 mTorr pressure (more generally from 1 mTorr to 20 mTorr), with $C_2F_6$ flow of 40 SCCM and oxygen flow of 5 SCCM (more generally from 10 SCCM of $C_2F_6$ to 200 SCCM, and 2 SCCM oxygen to 20 SCCM), bias power of 50 W (more generally 20 W to 100 W) and plasma source power of 1500 W (more generally 1000 W to 2000 W).

Desired features of this process for etching the liner dielectric are:
1) To etch it anisotropically which requires ion bombardment, and at the same time not to isotropically etch the sidewall of the low-k material whether it be bare organic dielectric or such that the silicon dioxide layer on its surface is breached.
2) To avoid ion energies above the sputter threshold as the liner is being etched through, so that substantially no copper atoms are sputtered up onto the sidewall of the via. Such copper would be able to diffuse through the dielectric causing eventual failure of the circuit due to poisoning of the semiconductor material. During this step it is also be desirable to avoid isotropically etching the low-k dielectric so that the material is not exposed to the reactive species during the liner etching.

The first requirement is mostly met during the first step of the process while the second requirement must be met during the second step. It is desirable that no copper be exposed during the first step when the higher ion energy would cause sputtering of the copper. This means that the remaining thickness of the liner should not be too variable from one area of the wafer to another or from one wafer to another. When such is the case it would be necessary to use only the lower ion energy second step for the entirety of the liner etching process so as to avoid sputtering. The lower ion energy in this step will result in longer etching time due to its lower etching rate.

Metal Surface Cleaning Process. This process does not vary based on whether silicon based or organic low-k dielectric is used. This process is used to remove contaminant elements remaining on the surface of the copper at the base of the via without sputtering the copper. The contaminant elements may include carbon, silicon, fluorine and oxygen. These may be bound in compounds with the copper so that it takes some activation energy to liberate them. This can be provided by energetic ions and hydrogen atoms. These species should be present in sufficient fluxes to rapidly reduce the molecular species at the surface of the copper and volatilize them so that the copper surface is left sufficiently clean to provide very good electrical contact when the via is filled with metal. Fortunately, hydrogen forms such volatile species with the above-mentioned impurities and therefore is desirable for this process. During this etch the low-k material should not be degraded or etched isotropically. For this reason, lower bias power may be desirable so that the ions do not sputter the exposed metal (especially copper) which is exposed below the liner. During this process step the wafer may be kept at or below 100 Celsius so that there is minimal reaction with the low-k dielectric on the sidewall. This will be more sensitive with organic dielectric than silicon-based dielectric.

Cleaning of the metal surface may take place in one or more steps and uses inert gas diluted hydrogen or pure hydrogen. Exemplary process parameters are:

20 mTorr pressure (more generally from 8 mTorr to 200 mTorr), hydrogen forming gas (e.g., 10% hydrogen in Helium), a flow of 100 SCCM (more generally from 10 SCCM to 1000 SCCM), bias power of 50 W (more generally 20 W to 100 W) and plasma source power of 1500 W (more generally 1000 W to 2000 W) where the bias voltage is held to less than or equal to about 25 Volts so as to eliminate sputtering of copper exposed at the bottom of the vias. Higher bias may be used in the event the metal underlayer is aluminum.

F. Alternate Sources

Some plasma sources, such as the small diameter, elongated cylinder-shaped, non-resonant microwave sources produce lower current densities than the low pressure inductive coupled source referred to above (which easily can produce of the order of 1 mA/cm$^2$ or more). Such lower current sources can successfully perform processes of the types described above if the rules for selection of proper gaseous mixtures and process conditions are observed. For these lower current sources, it may be advantageous to include in the feedgas easily ionized inert gas(es) to enhance the degree of ionization of the plasma, as well as the ion current density to the wafer. Furthermore, by operating such a biased-pedestal plasma system at slightly higher pressures (from about 30 to 200 mTorr) the maximum and average ion energies can be reduced moderately while the number of energetic particles striking the surface increases, due to the phenomenon of charge exchange of the energetic ions with neutral gas particles. However, the portion of the total power delivered to the plasma that goes into ionization usually decreases as the pressure is raised. This means, in general, that there will be fewer ions generated. This can be mitigated to some extent by employing mixtures of reactive gases such as oxygen, hydrogen, methane, alcohols and ammonia diluted in inert gases such as argon or helium. In the case of argon, there is significant ionization of the argon atoms yielding higher ion currents at the slightly higher pressures employed.

In the case of silicon containing low-k materials the process conditions for such alternative plasma source (non-resonant microwave) may be chosen to minimize etching or degrading the exposed sensitive material(s), whether it be protective oxide or low-k dielectric. In the case of the high dose ion implanted photoresist it is desirable that the ion energy be kept not too far above the threshold for sputtering of the silicon dioxide, which comprises the protective (sacrificial) layer of about 100 Angstroms covering the just implanted silicon regions. This threshold is about 18 electron Volts. The sputter yield per ion is a few times $10^{-5}$ per ion at ion energy of 20 eV rising exponentially to about $10^{-1}$ at 120 eV. Therefore, since we have found ion energies above 20 eV have the energy to facilitate the breaking of bonds in the photoresist crust (heavily crosslinked carbon polymer) but sputter silicon oxide very little, it is desirable to keep such ion energies in the range of 20 eV to about 60 eV. This ion energy may not be needed when the temperature of the wafer is higher (~250 C.) but at lower temperatures (<100 C.) where resist popping can be avoided, ion energy is desirable to provide activation energy to the reaction of oxygen with the carbon polymer. In fact, for a process with biasing power on the pedestal of 75 Watts (ion energies about 40 eV) and with an ion current density of about 4 mA/cm$^2$, only about 3 to 4 Angstroms of silicon dioxide are sputtered while about 1500 Angstroms of hardened photoresist crust are etched. This process is found to work well with pure oxygen gas injected into the source. This causes relatively little sputtering (than heavier atoms) while giving high etch rates of the carbon polymer crust. Fluorine would probably accelerate the etching of the photoresist, but simultaneously it would cause the silicon oxide to be etched chemically. Addition of other lighter gases which sputter silicon dioxide less but do not react so strongly with carbon generally lowers the rate of etching of the crust, reducing the cost effectiveness and throughput of the processing system.

Many modifications of the exemplary embodiments of the invention disclosed above will readily occur to the skilled in the art. Accordingly, the invention is to be construed as including all structure and methods that fall within the scope of the appended claims.

What is claimed is:

1. A method of removing photoresist from a semiconductor substrate, the method comprising.

providing a gas flow to a processing chamber including hydrogen as a principal reactive gas for removing the photoresist;

inductively coupling power from a first source to the gas within the processing chamber to generate a plasma;

providing power from a second source to a substrate support such that the substrate is exposed to plasma products within the processing chamber;

using the plasma products to remove the photoresist; and maintaining a gas pressure within the processing chamber of less than about 200 mTorr during at least a portion of the time that the substrate is exposed to the plasma products to remove the photoresist.

2. The method of claim 1, wherein the gas flow includes the principal gas, an inert diluent gas, and an additive gas.

3. The method of claim 2, wherein the principal gas is hydrogen, and the inert diluent gas is selected from the group consisting of helium, argon, and nitrogen.

4. The method of claim 2, wherein the principal gas is hydrogen, and the additive gas is selected from the group consisting of oxygen, methane, ammonia, water vapor, methyl alcohol, ethyl alcohol, nitrous oxide, nitric oxide, nitrogen dioxide, and oxides of sulfur.

5. The method of claim 1, wherein the gas flow is less than about 3,000 standard cubic centimeters per minute.

6. The method of claim 1, wherein the step of providing a first source of power to the gas within the processing chamber to generate a plasma further comprises providing a power within the range of about 1,000 to 2,500 watts at a frequency of about 13.56 MHz.

7. The method of claim 1, wherein the step of providing power from a second source to a substrate support further comprises supplying a bias power to the substrate support within the range of about 0.1 to 2.0 watts/cm$^2$.

8. The method of claim 1, further comprising the step of maintaining the substrate at a temperature of less than about 100° C.

9. The method of claim 4, wherein the principal gas is hydrogen, and the gas flow further comprises a halogen.

10. The method of claim 1, wherein the plasma is formed in the absence of oxygen.

11. The method of claim 1, wherein the plasma is formed in the absence of fluorine.

12. The method of claim 10, wherein the plasma is formed in the absence of fluorine.

13. The method of claim 1, wherein the pressure within the processing chamber is less than 10 mTorr.

14. The method of claim 11, wherein the pressure within the processing chamber is less than 10 mTorr.

15. The method of claim 1, wherein the hydrogen containing gas is provided at a flow of at least 50 SCCM.

16. The method of claim 11, where the hydrogen containing gas is provided at a flow of at least 50 SCCM.

17. The method of claim 1, wherein the hydrogen containing gas is provided at a flow sufficient to provide an etch rate of at least 2,000 Angstroms per minute.

18. The method of claim 1, wherein the gas flow further comprises oxygen at a flow rate substantially lower than the flow rate of the hydrogen containing gas.

19. The method of claim 18, wherein the flow rate of the oxygen is less than about 50 SCCM.

20. The method of claim 11, wherein the gas flow further comprises oxygen at a flow rate substantially lower than the flow rate of the hydrogen containing gas.

21. The method of claim 20, wherein the pressure within the processing chamber is less than 10 mTorr.

22. The method of claim 21, wherein the hydrogen containing gas is provided at a flow sufficient to provide an etch rate of at least 2,000 Angstroms per minute.

23. The method of claim 1, wherein the step of providing power from a first source to the gas within the processing chamber to generate a plasma further comprises the step of inductively coupling power from the first source to the gas within the processing.

24. The method of claim 21, wherein the step of providing power from a first source to the gas within the processing chamber to generate a plasma further comprises the step of inductively coupling power from the first source to the gas within the processing.

25. The method of claim 1, wherein the step of providing power from a second source to a substrate support further comprises supplying a bias power to the substrate support is within the range of 30 watts to 400 watts.

26. The method of claim 25, wherein the bias to the substrate support is within the range of 30 watts to 400 watts.

27. The method of claim 1, wherein the photoresist is removed in the presence of a low-k dielectric.

28. The method of claim 26, wherein the photoresist is removed in the presence of a low-k dielectric.

* * * * *